US011145633B2

(12) United States Patent
Chen et al.

(10) Patent No.: US 11,145,633 B2
(45) Date of Patent: Oct. 12, 2021

(54) SEMICONDUCTOR PACKAGE AND MANUFACTURING METHOD THEREOF

(71) Applicant: Taiwan Semiconductor Manufacturing Co., Ltd., Hsinchu (TW)

(72) Inventors: Wei-Yu Chen, New Taipei (TW); An-Jhih Su, Taoyuan (TW); Li-Hsien Huang, Hsinchu County (TW); Tien-Chung Yang, Hsinchu (TW); Ming-Shih Yeh, Hsinchu County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/795,523

(22) Filed: Feb. 19, 2020

(65) Prior Publication Data

US 2021/0066263 A1    Mar. 4, 2021

Related U.S. Application Data

(60) Provisional application No. 62/893,153, filed on Aug. 28, 2019.

(51) Int. Cl.
*H01L 25/10*    (2006.01)
*H01L 23/498*    (2006.01)
(Continued)

(52) U.S. Cl.
CPC ........ *H01L 25/105* (2013.01); *H01L 21/4857* (2013.01); *H01L 21/568* (2013.01); *H01L 23/3128* (2013.01); *H01L 23/49822* (2013.01); *H01L 24/05* (2013.01); *H01L 24/16* (2013.01); *H01L 25/50* (2013.01); *H01L 2224/0401* (2013.01); *H01L 2224/16235* (2013.01)

(58) Field of Classification Search
CPC . H01L 25/105; H01L 21/4857; H01L 21/568; H01L 23/3128; H01L 23/49822; H01L 24/05; H01L 24/16; H01L 25/50; H01L 2224/0401; H01L 2224/16235
See application file for complete search history.

(56) References Cited

U.S. PATENT DOCUMENTS 8,669,140 B1 *    3/2014    Muniandy ............. H01L 25/105
                                                         438/109
8,993,380 B2    3/2015    Hou et al.
(Continued)

*Primary Examiner* — Douglas W Owens
(74) *Attorney, Agent, or Firm* — JCIPRNET

(57) ABSTRACT

A semiconductor package and a manufacturing method thereof are provided. The semiconductor package includes a semiconductor die an insulating encapsulation laterally covering the semiconductor die. The semiconductor die includes a semiconductor substrate, a plurality of conductive pads distributed over the semiconductor substrate, a plurality of conductive vias disposed on and electrically connected to the conductive pads, and a dielectric layer disposed over the semiconductor substrate and spaced the conductive vias apart from one another. A sidewall of the dielectric layer extends along sidewalls of the conductive vias, the conductive vias are recessed from a top surface of the dielectric layer, and a sloped surface of the dielectric layer is connected to the top surface of the dielectric layer and the sidewall of the dielectric layer.

20 Claims, 30 Drawing Sheets

(51) Int. Cl.
*H01L 21/48* (2006.01)
*H01L 23/31* (2006.01)
*H01L 23/00* (2006.01)
*H01L 21/56* (2006.01)
*H01L 25/00* (2006.01)

(56) References Cited

U.S. PATENT DOCUMENTS

| | | | |
|---|---|---|---|
| 9,281,254 B2 | 3/2016 | Yu et al. | |
| 9,299,649 B2 | 3/2016 | Chiu et al. | |
| 9,372,206 B2 | 6/2016 | Wu et al. | |
| 9,425,126 B2 | 8/2016 | Kuo et al. | |
| 9,443,783 B2 | 9/2016 | Lin et al. | |
| 9,461,018 B1 | 10/2016 | Tsai et al. | |
| 9,496,189 B2 | 11/2016 | Yu et al. | |
| 9,666,502 B2 | 5/2017 | Chen et al. | |
| 9,735,131 B2 | 8/2017 | Su et al. | |
| 2004/0178491 A1* | 9/2004 | Akram | H01L 23/49827 257/686 |
| 2004/0259325 A1* | 12/2004 | Gan | H01L 25/0657 438/456 |
| 2011/0233747 A1* | 9/2011 | Lee | H01L 23/5389 257/686 |
| 2013/0154078 A1* | 6/2013 | Choi | H01L 23/36 257/706 |
| 2014/0048906 A1* | 2/2014 | Shim | H01L 21/561 257/531 |
| 2015/0021767 A1* | 1/2015 | Park | H01L 24/81 257/738 |
| 2016/0099206 A1* | 4/2016 | Margalit | H01L 23/49833 257/693 |
| 2017/0338128 A1* | 11/2017 | Huang | H01L 21/568 |
| 2018/0090409 A1* | 3/2018 | Huemoeller | H01L 24/96 |
| 2018/0151486 A1* | 5/2018 | Kobayashi | H01L 21/6835 |
| 2018/0374785 A1* | 12/2018 | Chang | H01L 23/3114 |
| 2019/0027446 A1* | 1/2019 | Cheng | H01L 21/6835 |
| 2020/0135606 A1* | 4/2020 | Pan | H01L 24/81 |
| 2020/0328144 A1* | 10/2020 | Fan | H01L 21/56 |

\* cited by examiner

SEMICONDUCTOR PACKAGE AND MANUFACTURING METHOD THEREOF

CROSS-REFERENCE TO RELATED APPLICATION

This application claims the priority benefit of U.S. provisional application Ser. No. 62/893,153, filed on Aug. 28, 2019. The entirety of the above-mentioned patent application is hereby incorporated by reference herein and made a part of this specification.

BACKGROUND

The semiconductor industry has experienced rapid growth due to continuous improvements in the integration density of a variety of electronic components (e.g., transistors, diodes, resistors, capacitors, etc.). For the most part, these improvements in integration density have come from repeated reductions in minimum feature size, which allows more components to be integrated into a given area. Technological advances in integrated circuit (IC) design have produced generations of ICs where each generation has smaller and more complex circuit designs than the previous generation. Examples of the type of device packages for semiconductors include three-dimensional integrated circuits (3DICs), wafer level packages (WLPs), and package on package (PoP) devices, etc. However, these advances have increased the complexity of processing and manufacturing. Accordingly, there has grown a need for smaller, more reliable and more creative semiconductor packaging techniques.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2-5A, 6A, 7A and 8-11 are schematic cross-sectional views of various stages of manufacturing a semiconductor package in accordance with some embodiments.

DETAILED DESCRIPTION

Figure 1:
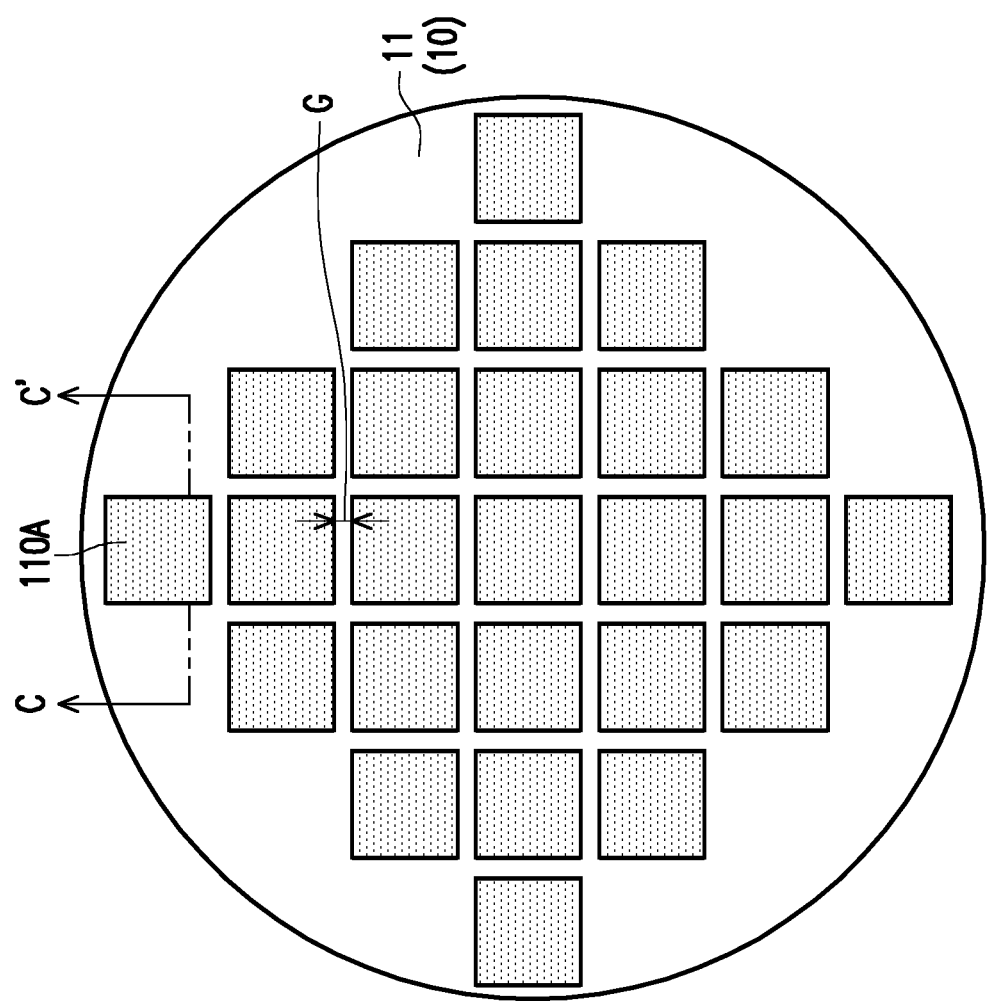
FIG. 1 is a schematic top view illustrating a plurality of semiconductor dies disposed on a temporary carrier in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

A semiconductor package including recessed conductive vias and the manufacturing method thereof are provided in accordance with various embodiments. The intermediate stages of forming a semiconductor package are illustrated in accordance with some embodiments. Some variations of some embodiments are discussed. It should be appreciated that the illustration throughout the drawings are schematic and not in scale. Throughout the various views and illustrative embodiments, the identical or similar numbers refer to the identical or similar elements.

FIG. 1 is a schematic top view illustrating a plurality of semiconductor dies disposed on a temporary carrier in accordance with some embodiments, and FIGS. 2-5A, 6A, 7A and 8-10 are schematic cross-sectional views of various stages of manufacturing a semiconductor package in accordance with some embodiments, where the cross-sectional views of FIGS. 2-5A, 6A, 7A, and 8-10 are taken along a C-C' line shown in FIG. 1. In addition, FIGS. 5B, 6B, and 7B are schematic top views of FIGS. 5A, 6A, and 7B, respectively, in accordance with some embodiments.

Figure 2:
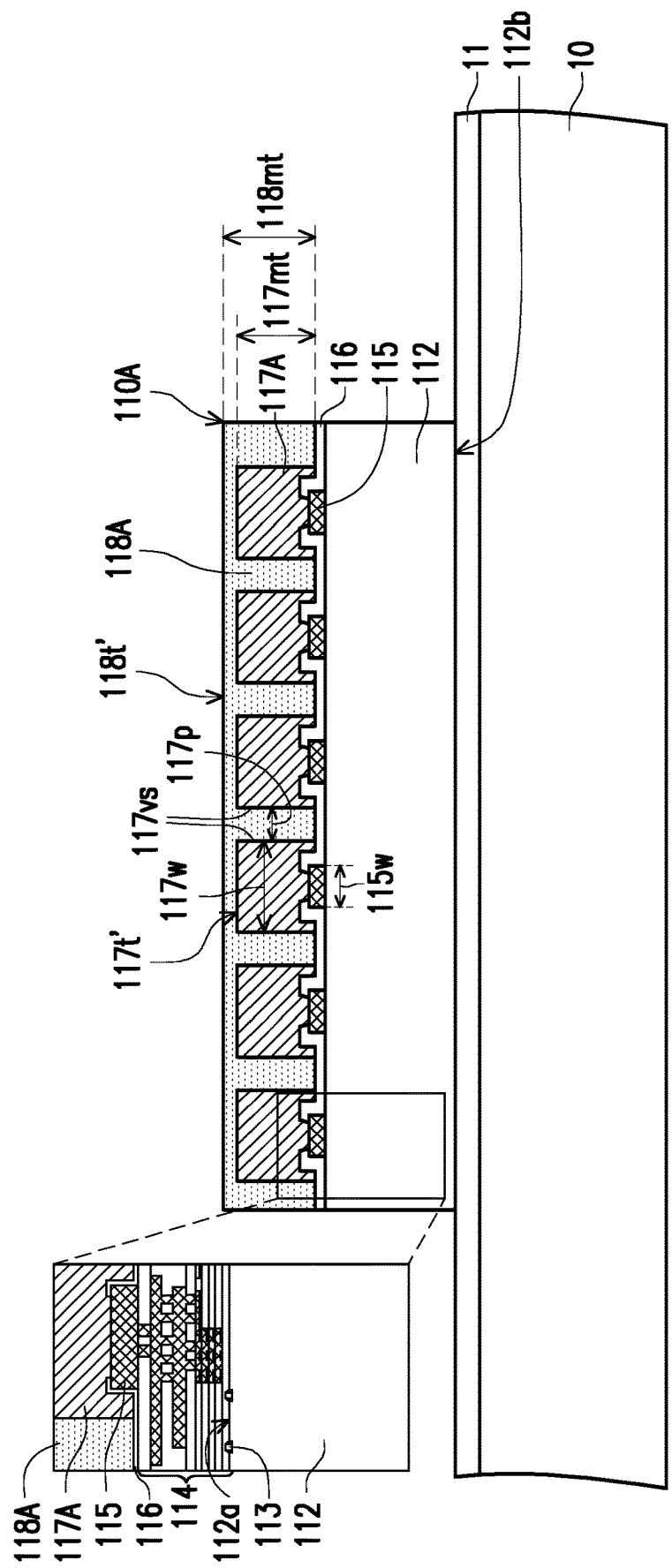

Referring to FIGS. 1 and 2, a plurality of semiconductor dies 110A are disposed on a temporary carrier 10. The temporary carrier 10 may be a glass carrier, a ceramic carrier, a metal carrier, or the like. It should be noted that the temporary carrier 10 is illustrated as a wafer form; however, the temporary carrier 10 may take various forms (e.g., chip form, panel form, etc.) depending on process requirements. In some embodiments, the semiconductor dies 110A are disposed on the temporary carrier 10 through a de-bonding layer 11. The de-bonding layer 11 is formed on the temporary carrier 10 by, for example, a spin coating process or other suitable deposition method. In some embodiments, the de-bonding layer 11 is formed of an adhesive such as Ultra-Violet (UV) glue, Light-to-Heat Conversion (LTHC) glue, or other types of adhesives. In some embodiments, the de-bonding layer 11 is decomposable under the heat of light to release the temporary carrier 10 from the overlying structures that will be formed in subsequent steps.

For example, the semiconductor dies 110A are singulated from a device wafer (not shown), and then the known-good-dies are selected and attached onto the temporary carrier 10 by, for example, a pick-and-place process. The semiconductor die 110A may be or may include a logic die, such as a central processing unit (CPU) die, a graphic processing unit (GPU) die, a micro control unit (MCU) die, an input-output (I/O) die, a memory die, a baseband (BB) die, an application processor (AP) die, or the like. It should be appreciated that the number and the function of the semiconductor dies to be packaged may depend on the product requirements. The same type of the semiconductor dies or different types of the semiconductor dies may be placed on the temporary carrier 10. In some embodiments, as shown in FIG. 1B, the semiconductor dies 110A are separately disposed on the temporary carrier 10 in an array. A gap G is formed between adjacent two of the semiconductor dies 110A. It should be noted that the configuration shown in FIG. 1 is merely an example, and other configurations are possible.

Continue to FIG. 2, the respective semiconductor die 110A may include a semiconductor substrate 112, a plurality of conductive pads 115 disposed over the semiconductor substrate 112, a passivation layer 116 disposed over the semiconductor substrate 112 and partially covering the conductive pads 115, a plurality of conductive pillars 117A disposed on the passivation layer 116 and electrically connected to the conductive pads 115, and a dielectric material 118A disposed on the passivation layer 116 and covering the conductive pillars 117A for protection. In some embodiments, the semiconductor substrate 112 has a front surface 112a and a back surface 112b opposite to each other, where the back surface 112b of the semiconductor substrate 112 faces the temporary carrier 10, and the conductive pads 115 and the conductive pillars 117A are formed over the front surface 112a of the semiconductor substrate 112. In some embodiments, the semiconductor substrate 112 is or includes a bulk silicon substrate or other semiconductor materials (e.g., including group III, group IV, group V elements, or the like). In other embodiments, the semiconductor substrate 112 is or includes a silicon-on-insulator substrate, a germanium-on-insulator substrate, and/or the like.

In some embodiments, the conductive pads 115 are distributed over the front surface 112a of the semiconductor substrate 112. A material of the conductive pads 115 may include aluminum, but other suitable conductive materials (e.g., copper, metal alloy, etc.) may be used. In some embodiments, the passivation layer 116 includes a plurality of openings (not labelled) accessibly exposing at least a portion of the conductive pads 115. In some embodiments, the passivation layer 116 is a non-low-k dielectric layer. For example, the material of the passivation layer 116 includes silicon oxide, silicon nitride, un-doped silicate glass, polyimide, or the like. In other embodiments, the passivation layer 116 is omitted.

In some embodiments, the conductive pillars 117A are formed on the passivation layer 116, and a portion of the respective conductive pillar 117A extends into the openings of the passivation layer 116 to be in electrical and physical contact with the underlying conductive pad 115. For example, each of the conductive pillars 117A is formed in one of the openings of the passivation layer 116. A material of the conductive pillars 117A may include copper or copper alloys, although other metals (e.g., aluminum, silver, gold, and combinations thereof, etc.) may be used. In some embodiments, the top width 117w (or diameter) of the respective conductive pillar 117A is greater than the width (or diameter) of the corresponding opening of the passivation layer 116. In some embodiments, the top width 117w of the respective conductive pillar 117A is greater than the maximum width 115w of the underlying conductive pad 115. In other embodiments, the top width 117w of the respective conductive pillar 117A is substantially equal to or smaller than the maximum width 115w of the underlying conductive pad 115.

In some embodiments, the array of the conductive pillars 117A is formed in a fine-pitched arrangement to enable high-density electrical connection. For example, a spacing 117p between two of the adjacent conductive pillars 117A is in a range about 3~5 μm, where the spacing 117p may be a shortest lateral distance from a vertical sidewall 117vs of one of the conductive pillars 117A to the vertical sidewall 117vs of adjacent one of the conductive pillars 117A. In other embodiments, the spacing 117p between two of the adjacent conductive pillars 117A is greater or smaller than 5 μm. It is appreciated that the values recited throughout the description are merely examples, and may be changed to different values. It is noted that for ease of description, and without intending the structures disclosed herein to be limited to any particular orientation, a direction perpendicular to planes of the back surface 112b of the semiconductor substrate 112 is referred to as a vertical direction and a direction parallel to planes of the back surface 112b of the semiconductor substrate 112 is referred to as a lateral direction.

It should be noted that the semiconductor dies are illustrated in a simplified manner. For example, the respective semiconductor die 110A includes a plurality of integrated circuit components 113 and an interconnect structure 114. The integrated circuit components 113 may be formed on the front surface 112a of the semiconductor substrate 112, and the interconnect structure 114 may be formed on the front surface 112a of the semiconductor substrate 112 and may electrically connect the conductive pads 115 to the integrated circuit components 113. The integrated circuit components 113 may be or may include active components (e.g., transistors or the like) and, optionally, passive components (e.g., resistors, capacitors, inductors, etc.) to generate the desired functional requirements for the semiconductor die 110A. In some embodiments, the integrated circuit components 113 are formed in a front-end-of-line (FEOL), and the interconnect structure 114 may be formed in a back-end-of-line (BEOL). The interconnect structure 114 may be electrically connected to various integrated circuit components 113 to form functional circuits within each semiconductor die 110A. In some embodiments, the interconnect structure 114 includes inter-layer dielectric (ILD) and/or inter-metal dielectric (IMD) layers containing conductive features (e.g., conductive lines, vias, pads, etc.), where the ILD layer is formed over the semiconductor substrate 112 and covering the integrated circuit components 113, and the IMD layer is formed over the ILD layer. In some embodiments, the ILD layer and the IMD layer are formed of a low-K dielectric material, such as phosphosilicate glass (PSG), borophosphosilicate glass (BPSG), SiOxCy, Spin-On-Glass, Spin-On-Polymers, silicon carbon material, combinations thereof, or the like. The ILD layer and the IMD layer may include any suitable number of dielectric material layers which is not limited thereto.

Still referring to FIG. 2, at this stage, the conductive pillars 117A are buried in the dielectric material 118A. In some embodiments, the top surfaces 117t' of the conductive pillars 117A are between a top surface 118t' of the dielectric material 118A and the back surface 112b of the semiconductor substrate 112 (or the front surface 112a where the conductive pads 115 are disposed over). For example, relative to the back surface 112b of the semiconductor substrate 112 (or the front surface 112a where the conductive pads 115 are disposed over), a top surface 118t' of the dielectric material 118A is higher than the top surfaces 117t' of the conductive pillars 117A. It is noted that for ease of description, a top surface as referred to herein is an accessibly exposed surface of the structure to be processed during fabrication, and the top surface (e.g., an outward facing surface) includes materials and structures that may change with successive steps and evolve with the layer processing of the structure.

In some embodiments, the maximum thickness 118mt of the dielectric material 118A is greater than the maximum thickness 117mt of the respective conductive pillar 117A. For example, the dielectric material 118A protects the conductive pillars 117A from damage when performing the steps of singulating from the device wafer, placing on the temporary carrier 10, etc. The dielectric material 118A may be formed using chemical vapor deposition (CVD), plasma-enhanced CVD (PECVD), spin-on coating, a combination thereof, or the like. In some embodiments, a material of the dielectric material 118A includes polybenzoxazole (PBO), polyimide (PI), benzocyclobutene (BCB), or other dielectric material that is electrically insulating.

Figure 3:
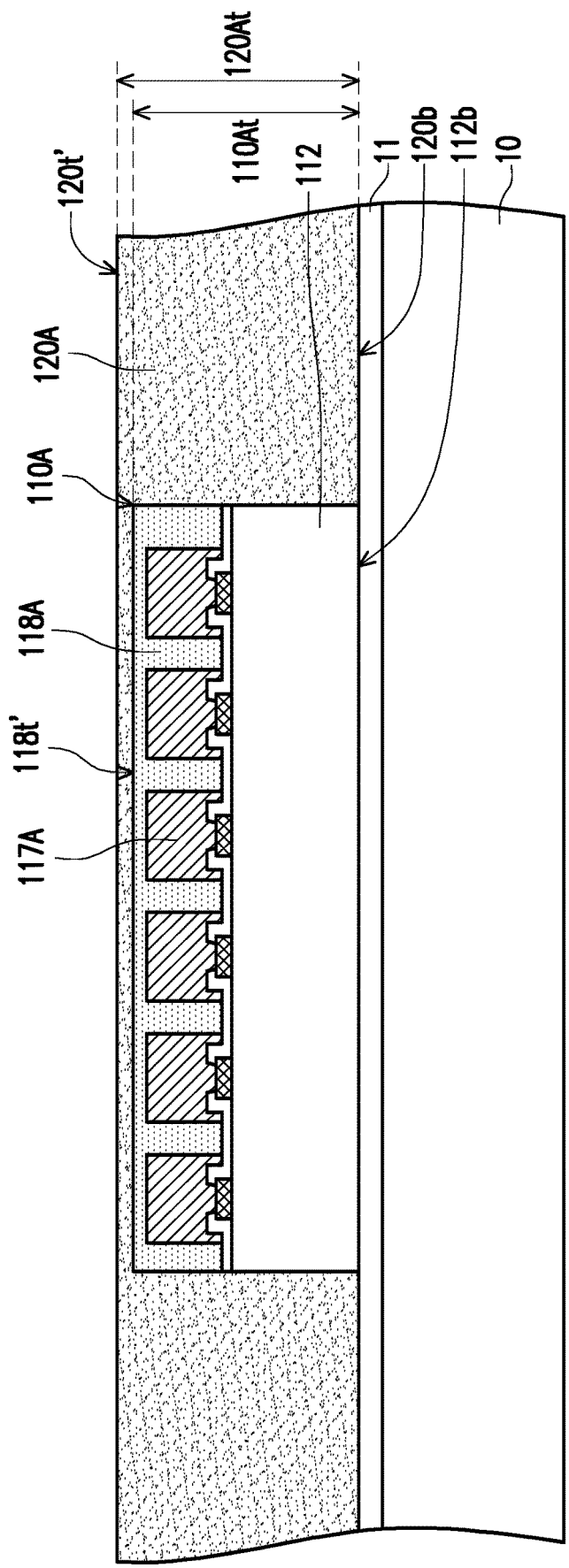

Referring to FIG. 3, an insulating material 120A is formed over the temporary carrier 10 to encapsulate the semiconductor die 110A. The insulating material 120A may be or may include molding compound, molding underfill, epoxy resin, or the like, and may be applied by compression molding, transfer molding, or the like. A curing process is optionally performed to harden the insulating material 120A for optimum protection. In some embodiments, the semiconductor die 110A is over-molded by the insulating material 120A. For example, at this stage, the maximum thickness 120At of the insulating material 120A is greater than the overall thickness 110At of the semiconductor die 110A, where the maximum thickness 120At of the insulating material 120A is measured from the bottom surface 120b to the top surface 120t', and the overall thickness 110At of the semiconductor die 110A may be measured from the back surface 112b of the semiconductor substrate 112 to the top surface 118t' of the dielectric material 118A. In some embodiments, the semiconductor dies 110A are spaced apart from one another by the insulating material 120A. For example, the gap G (shown in FIG. 1) between the semiconductor dies 110A are filled by the insulating material 120A, and the insulating material 120A extends along the sidewalls of the respective semiconductor die 110A.

Figure 4:
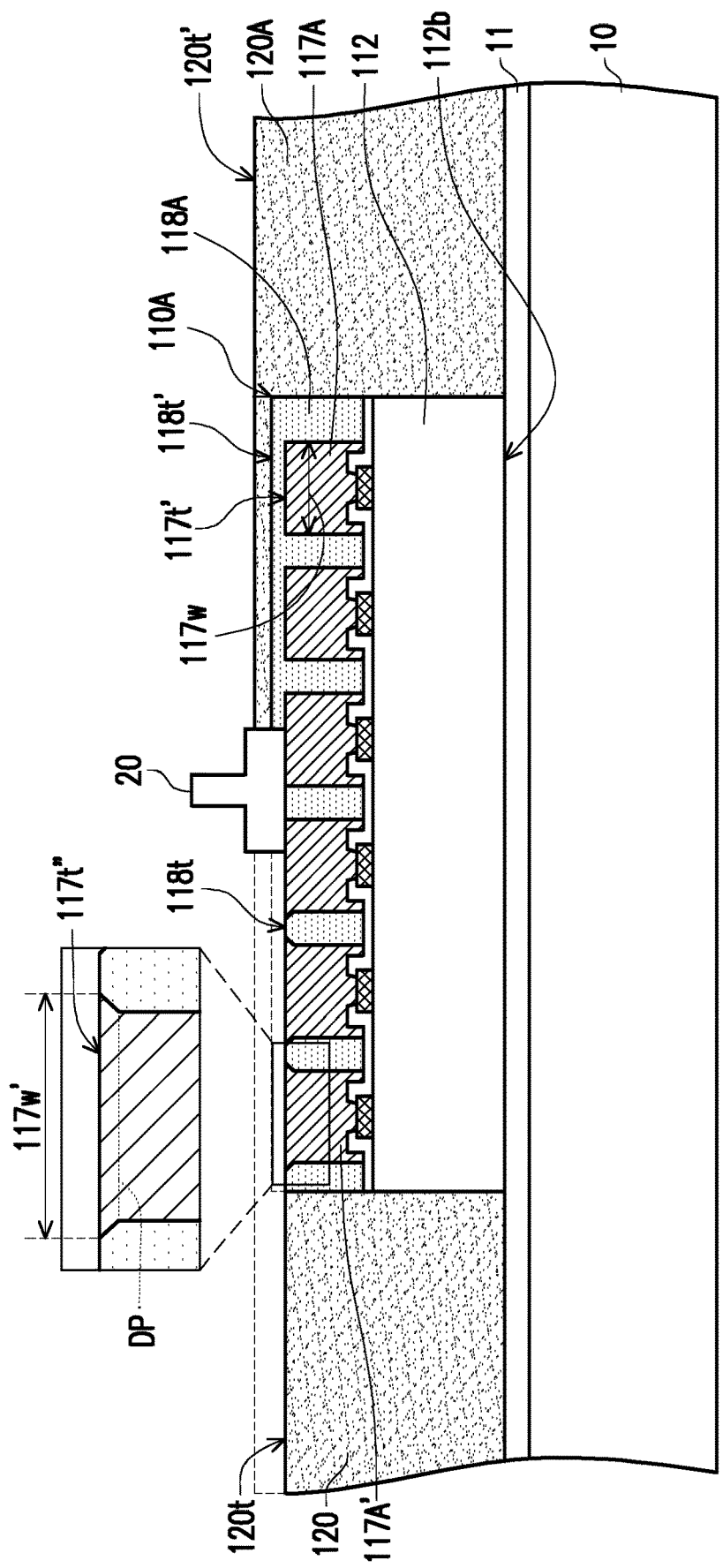
Figure 5A:
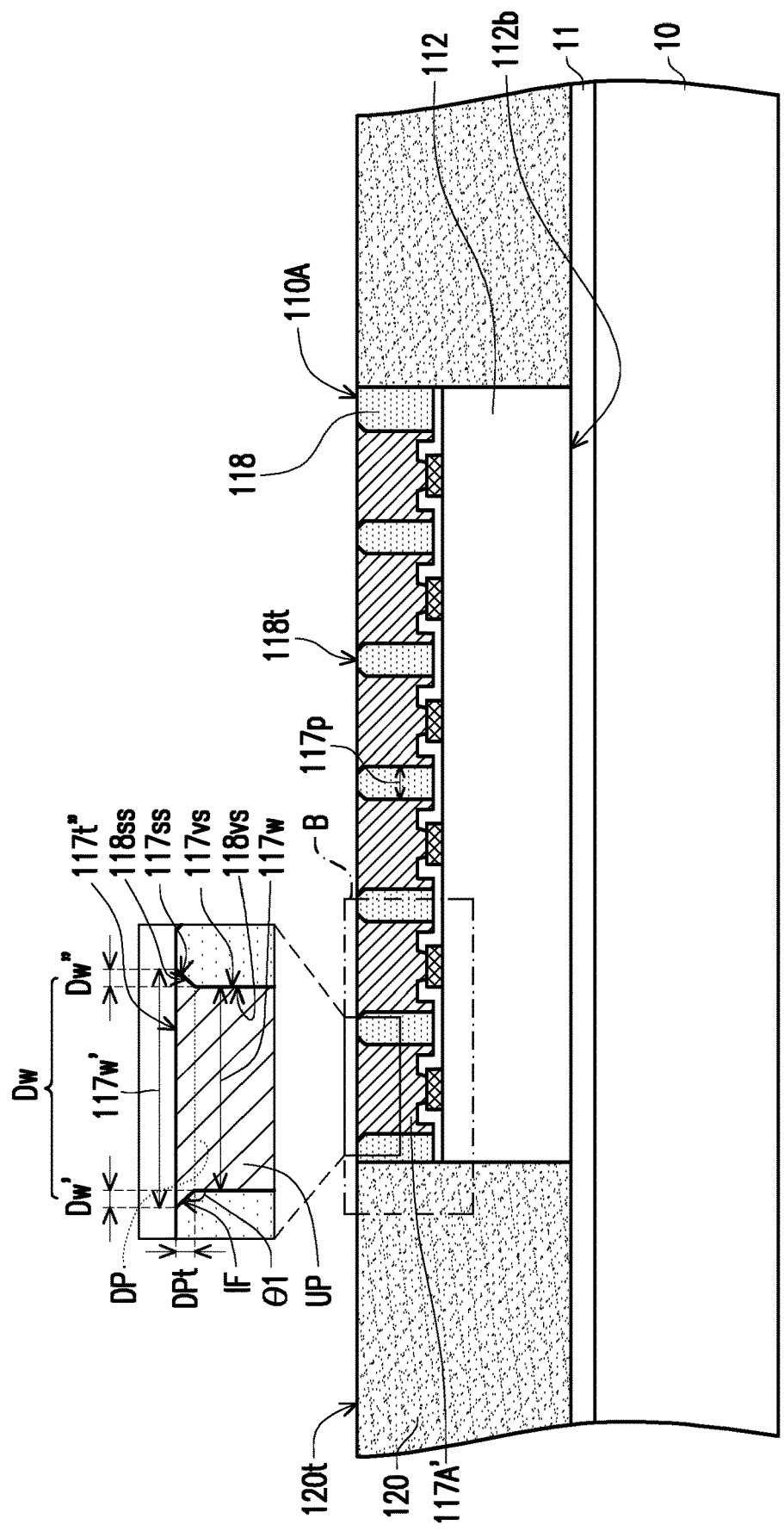
Figure 5B:
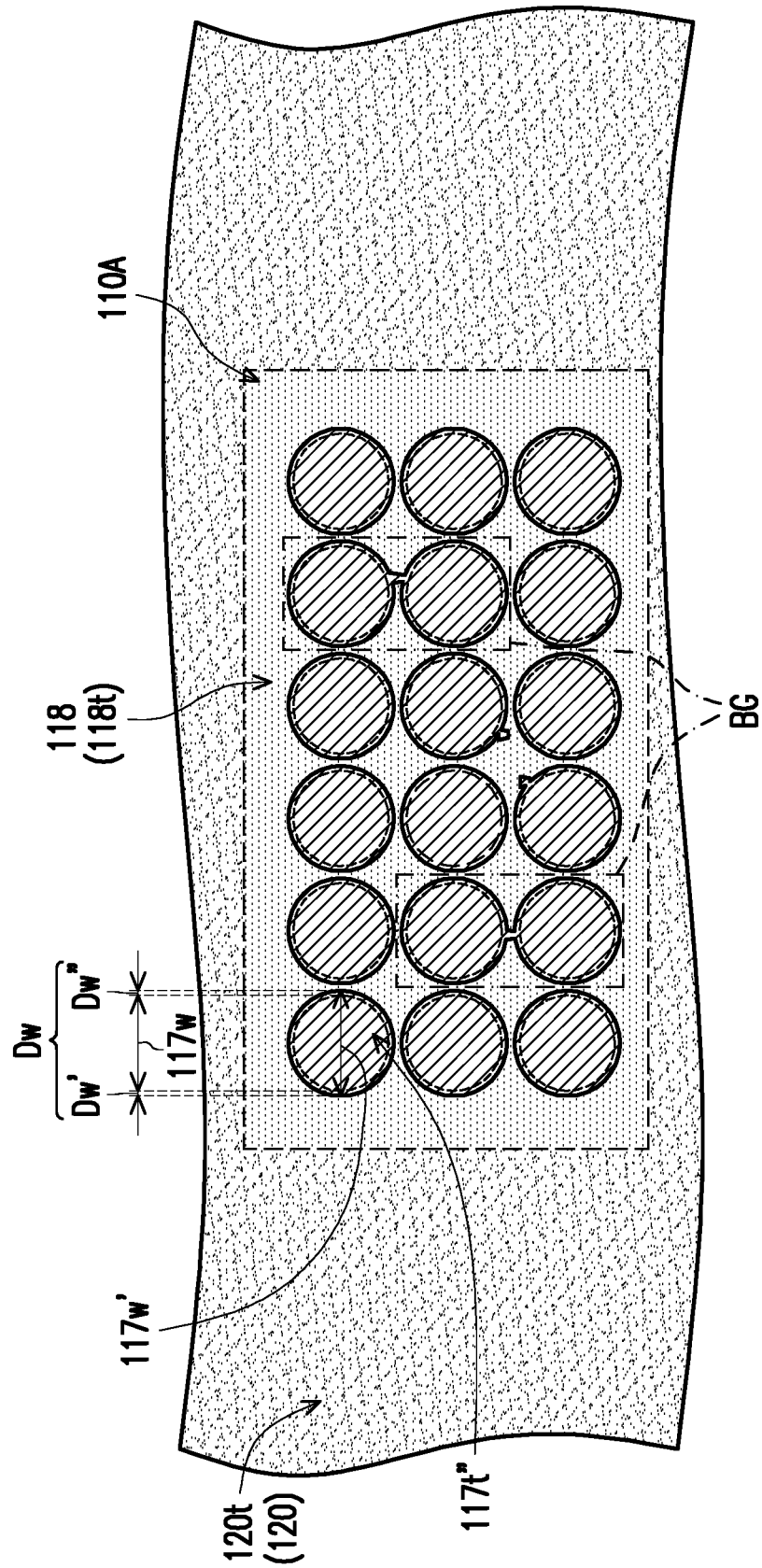
FIG. 5B is a schematic top view of FIG. 5A in accordance with some embodiments.

Referring to FIGS. 4, 5A and 5B, a planarization process is performed on the insulating material 120A to remove a portion of the insulating material 120A, until at least a portion of the conductive pillars 117A of the semiconductor die 110A is accessibly revealed. In some embodiments, during the planarization process, portions of the dielectric material 118A and the insulating material 120A that are over the conductive pillars 117A are removed. Part of the removed portions of the insulating material 120A and the dielectric material 118A are shown in phantom in FIG. 4. Due to the planarization, the insulating material 120A and the dielectric material 118A may be reduced in thickness to form an insulating encapsulation 120 and a dielectric layer 118, respectively. In some embodiments, due to the planarization, the conductive pillars 117A are planarized and render planarized top surfaces 117t''. The planarized top surfaces 117t'' of the planarized conductive pillars 117A' may be exposed by the planarized top surface 118t of the dielectric layer 118. In some embodiments, as shown in FIG. 5A, the planarized top surfaces 117t'' of the planarized conductive pillars 117A' are substantially levelled (e.g. coplanar) with the planarized top surface 118t of the dielectric layer 118, and may be substantially levelled (e.g., coplanar) with the planarized top surface 120t of the insulating encapsulation 120. The planarization process may include a grinding process, a chemical mechanical polishing (CMP) process, and/or other suitable removing process.

Continue to FIG. 4, the structure is planarized by a planarizing tool 20. In some embodiments, the planarizing tool 20 includes a grinding wheel for grinding the structure. It is appreciated that wheel loadings may be different for grinding different materials (e.g., the insulating material 120A, the dielectric material 118A, and the conductive pillars 117A). In some embodiments, deformation may occur to the tops of the conductive pillars 117A that undergo the grinding. As shown in FIG. 4, the planarized conductive pillars 117A' that have been planarized and the conductive pillars 117A that have not been grinded yet have different cross sections. For example, the planarized top surface 117t'' of the planarized conductive pillar 117A' expands wider than the top surface 117t' of the corresponding conductive pillar 117A that has not been grinded yet. In some embodiments, the top width (or diameter) 117w' of the planarized top surface 117t'' is greater than the top width 117w of the top surface 117t' (shown in FIG. 2). For example, during the planarization, the top of the respective conductive pillar 117A is subjected to the force produced by the planarizing tool 20, resulting in a deformed portion DP (separated by the dashed line). For example, the respective conductive pillar 117A includes the deformed portion DP and the underlying portion UP that is connected to and located below the deformed portion DP.

Continue to FIGS. 5A and 5B, the top width 117w' of the planarized top surface 117t'' of the planarized conductive pillar 117A' may be the combination of the top width 117w and the deformed width Dw, where the deformed width Dw are formed after the planarization and includes the widths (Dw' and Dw'') that are extending at two opposing sides of the top width 117w. In some embodiments, the width of the deformed portion DP is greatest at the top and decreases downwardly. For example, in a cross section, the conductive pillar 117A has a top in the shape of a rectangle, and after the planarization, the planarized conductive pillar 117A' has a top in the shape of an inverted trapezoid. In some embodiments, after the planarization process is performed on the conductive pillar 117A, the top of the conductive pillar 117A is deformed to have the deformed portion DP in the shape of an inverted truncated cone. For example, the deformed portion DP is tapered in a direction from the planarized top surface 117t'' toward the underlying portion UP.

Continue to FIGS. 5A and 5B, a sloped interface IF may be formed between the deformed portion DP of the planarized conductive pillar 117A' and the dielectric layer 118. In some embodiments, the deformed portion DP of each of the planarized conductive pillars 117A' includes a sloped surface 117ss that is connected to the planarized top surface 117t'' and the vertical sidewall 117vs. For example, the vertical sidewall 117vs and the sloped surface 117ss are angled relative to one another. In some embodiments, the vertical sidewall 117vs forms an angle θ1 with the sloped surface 117ss, where the angle θ1 therebetween is an obtuse angle (i.e. greater than 90 degrees). In some embodiments, the angle θ1 is about 135 degrees. The dielectric layer 118 correspondingly includes the sloped surface 118ss that is connected to the planarized top surface 118t and the vertical sidewall 118vs, where the sloped interface IF is between the sloped surface 118ss of the dielectric layer 118 and the sloped surface 117ss of the planarized conductive pillars 117A'. In some embodiments, the thickness DPt of the deformed portion DP is in a range about 0.1~2 μm, where the thickness DPt of the deformed portion DP is measured from the intersection (e.g., between the vertical sidewall 117vs and the sloped surface 117ss) and extending in the vertical direction to the planarized top surface 117t''. In other embodiments, the thickness DPt of the deformed portion DP is less or greater than 2 μm. It is appreciated that the values recited herein are examples, and may be changed to different values.

Still referring to FIGS. 5A and 5B, in a top view, the planarized top surface 117t'' includes a circular shape, an oval shape, a rectangular shape, a polygonal shape, an irregular shape, or the like. It is noted that the shape and size of the deformed portions DP of the planarized conductive pillars 117A' serve as an example, and the disclosure is not limited thereto. For example, a degree of deformity of the respective conductive pillar 117A' may be similar or may be different. In some embodiment, the planarized conductive pillars 117A' are deformed in a uniform manner after the planarization. In other embodiment, the deformation of the planarized conductive pillars 117A' is not uniform. In some embodiments, a portion of the planarized conductive pillars 117A' is slightly deformed. For example, the boundaries of neighboring planarized conductive pillars 117A' are not in contact with one another, and at least a portion of the dielectric layer 118 is spaced therebetween. For example, the deformed width Dw (i.e. the combination of the widths Dw' and Dw'') is less than the spacing 117p between the vertical sidewalls 117s of neighboring planarized conductive pillars 117A'. For example, the deformed width Dw is less than about 5 μm. In some embodiments, at least one of the widths (Dw' and Dw'') is about 2 μm.

In some embodiments, a portion of the planarized conductive pillars 117A' deformed and bridged to one another. For example, in a top view, at least a portion of the boundaries of neighboring planarized conductive pillars 117A' is linked to one another. For example, since the conductive pillars 117A are distributed in the fine-pitched arrangement, when adjacent ones of the planarized conductive pillars 117A' are deformed greater than or substantially equal to the spacing 117p, the bridging occurs. The bridging may cause the shorting of integrated circuits in some circumstances. For example, the planarized conductive pillars 117A' in the dot-dashed box BG are bridged together. It is noted that the configuration of the semiconductor die 110A illustrated in FIG. 5B is an example and construe no limitation in the disclosure.

Figure 6A:
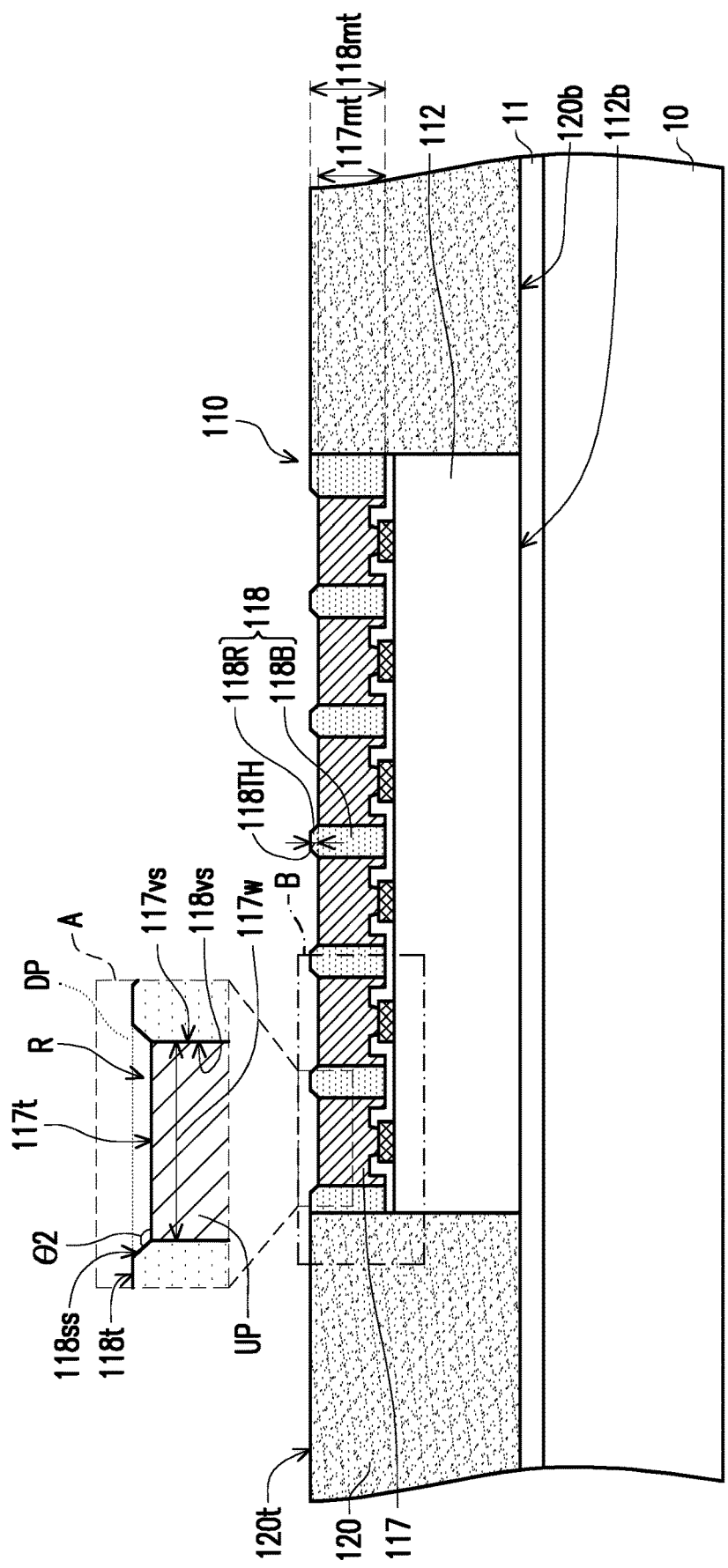
Figure 6B:
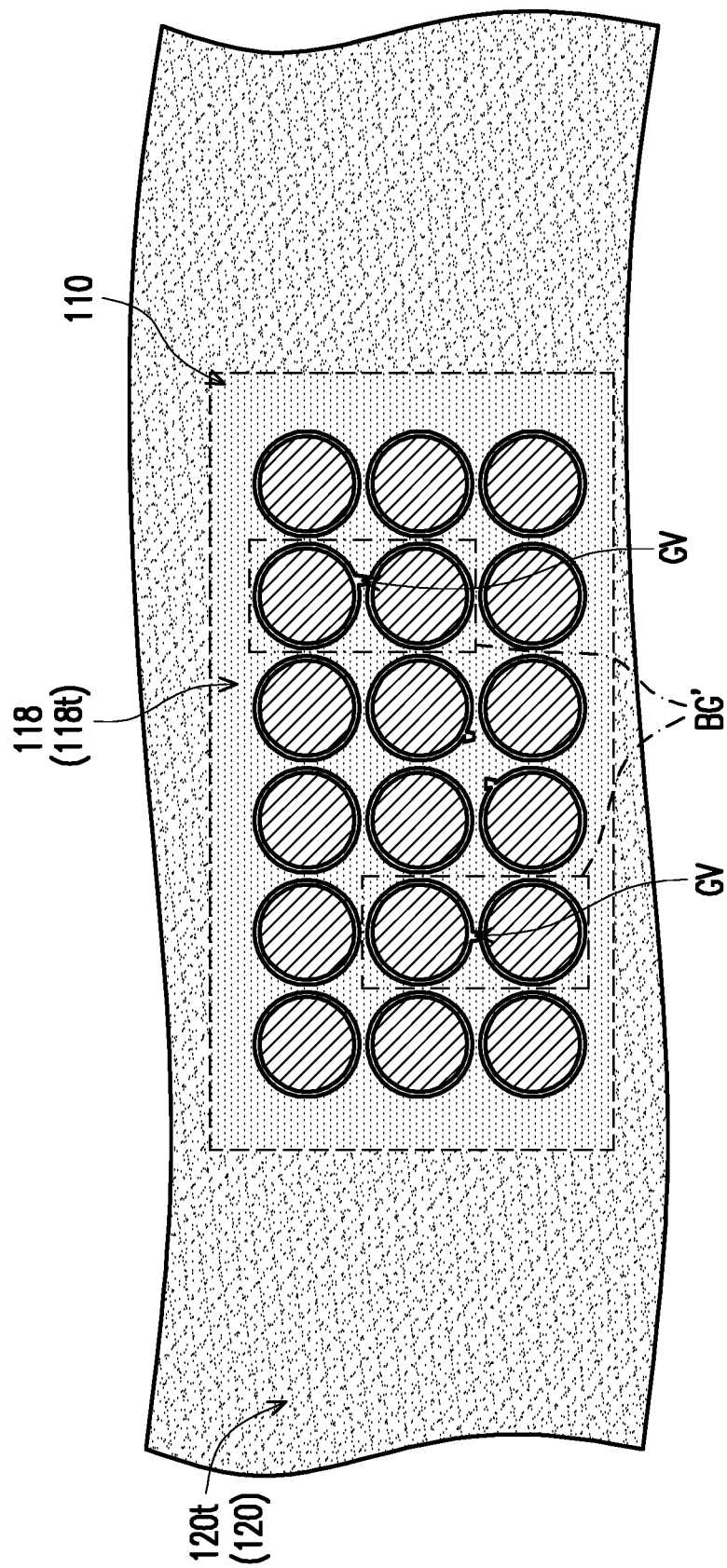
FIG. 6B is a schematic top view of FIG. 6A in accordance with some embodiments.

Referring to FIGS. 6A and 6B, after the planarization, a portion of the respective planarized conductive pillar 117A' is removed to form a conductive via 117. At this stage, a semiconductor die 110 including recessed conductive vias is formed. In some embodiments, an etching process is performed to selectively remove the planarized conductive pillars 117A'. During the etching, the insulating encapsulation 120 and the dielectric layer 118 may not be removed (or the negligible amount of the insulating encapsulation 120 and the dielectric layer 118 may be removed). For example, the planarized conductive pillars 117A' are dry etched using time mode. The optimal operation time may be determined through experimentation or simulation. Other suitable techniques may be employed to reduce the thickness of the respective planarized conductive pillar 117A' as long as the bridging of the planarized conductive pillars 117A' is eliminated. In some embodiments, a cleaning process is performed to remove the residues of the conductive material. In some embodiments, the deformation portion DP of the respective planarized conductive pillar 117A' is removed and only underlying portion UP is remained. In other embodiments, when removing the deformation portion DP, the underlying portion UP is slightly removed. Alternatively, the deformation portion DP is partially removed. The variations will be explained in greater detail in accompanying with FIGS. 13A to 13C.

For example, after removing the portions of the planarized conductive pillars 117A', the accessible top surfaces 117t of the conductive vias 117 are non-coplanar with the planarized top surface 118t of the dielectric layer 118 and the planarized top surface 120t of the insulating encapsulation 120. For example, the accessible top surface 117t of the respective conductive via 117 is lower than the planarized top surface 120t of the insulating encapsulation 120, relative to the back surface 120b of the insulating encapsulation 120. The planarized top surface 118t of the dielectric layer 118 may be higher than the accessible top surface 117t of the respective conductive via 117, relative to the back surface 112b of the semiconductor substrate 112. For example, the accessible top surfaces 117t of the conductive vias 117 are between the planarized top surface 118t of the dielectric layer 118 and the back surface 112b of the semiconductor substrate 112.

In some embodiments, the maximum thickness 118mt of the dielectric layer 118 is greater than the maximum thickness 117mt of the respective conductive via 117. In some embodiments, after forming the conductive vias 117, at least a portion of the sloped surface 118ss of the dielectric layer 118 is accessibly revealed. For example, the sloped surface 118ss of the dielectric layer 118 forms an angle θ2 with the accessible top surface 117t of the respective conductive via 117, where the angle θ2 therebetween is an obtuse angle (i.e. greater than 90 degrees). The interface of the conductive via 117 and the dielectric layer 118 surrounding the conductive via 117 may be various depending on process recipes, and the variations will be explained in greater detail in accompanying with FIGS. 13A to 13C.

Continue to FIGS. 6A and 6B, after removing the portions of the planarized conductive pillars 117A', the conductive vias 117 are recessed from the planarized top surface 118t of the dielectric layer 118. For example, a recess R is formed corresponding to the accessible top surface 117t of the respective conductive via 117. In some embodiments, the recess R has a profile that is tapered in a thickness direction toward the accessible top surface 117t of the respective conductive via 117. In some embodiments in which a portion of the planarized conductive pillars 117A' are bridged together (e.g. those are in the dot-dashed box BG of FIG. 5B), after removing the portions of the planarized conductive pillars 117A', they are physically disconnected from one another and may form grooves GV on the dielectric layer 118 as shown in the dot-dashed box BG' of FIG. 6B.

For example, a portion of the dielectric layer 118 is spatially apart the neighboring conductive vias 117 from one another. In some embodiments, the portion of the dielectric layer 118 disposed between the neighboring conductive vias 117 includes a base part 118B and a ridge part 118R connected to the base part 118B, where the base part 118B and the ridge part 118R are respectively illustrated in phantom in FIG. 6A. The base part 118B may extend along the vertical sidewalls 117vs of the adjacent conductive vias 117 and may be in physical contact with the adjacent conductive vias 117. The conductive vias 117 may be recessed relative to the ridge part 118R of the dielectric layer 118. For example, the ridge part 118R disposed on the base part 118B is higher than the adjacent conductive vias 117 and may not be in contact with the conductive vias 117.

In some embodiments, the ridge part 118R has a cross section that is shaped in a trapezoid. In such embodiments in which the ridge part 118R includes a trapezoidal cross section, the cross section of the ridge part 118R has a pair of lateral sides (i.e. sloped surfaces 118ss) and a pair of parallel sides (i.e., the planarized top surface 118t and the phantom surface between the base part 118B and the ridge part 118R). Alternatively, the cross section of the ridge part 118R may be shaped in a triangle. In such embodiments in which the ridge part 118R includes a triangular cross section, the cross section of the ridge part 118R has a side on the phantom surface (e.g., between the base part 118B and the ridge part 118R) and the other two sides (i.e. the sloped surfaces 118ss) forming an acute angle at the apex opposed to the phantom surface. In some embodiments, the maximum thickness 118TH of the ridge part 118R may be viewed as the maximum depth of the recess R. In other embodiments, the maximum depth of the recess R is greater or less than the maximum thickness 118TH of the ridge part 118R. For example, the maximum depth of the recess R is in a range about 0.1~2 µm. The maximum thickness 118TH and the top width of the ridge part 118R may be various and may depend on the deformed portions DP of the planarized conductive pillars 117A' (illustrated in FIGS. 5A-5B).

Figure 7A:
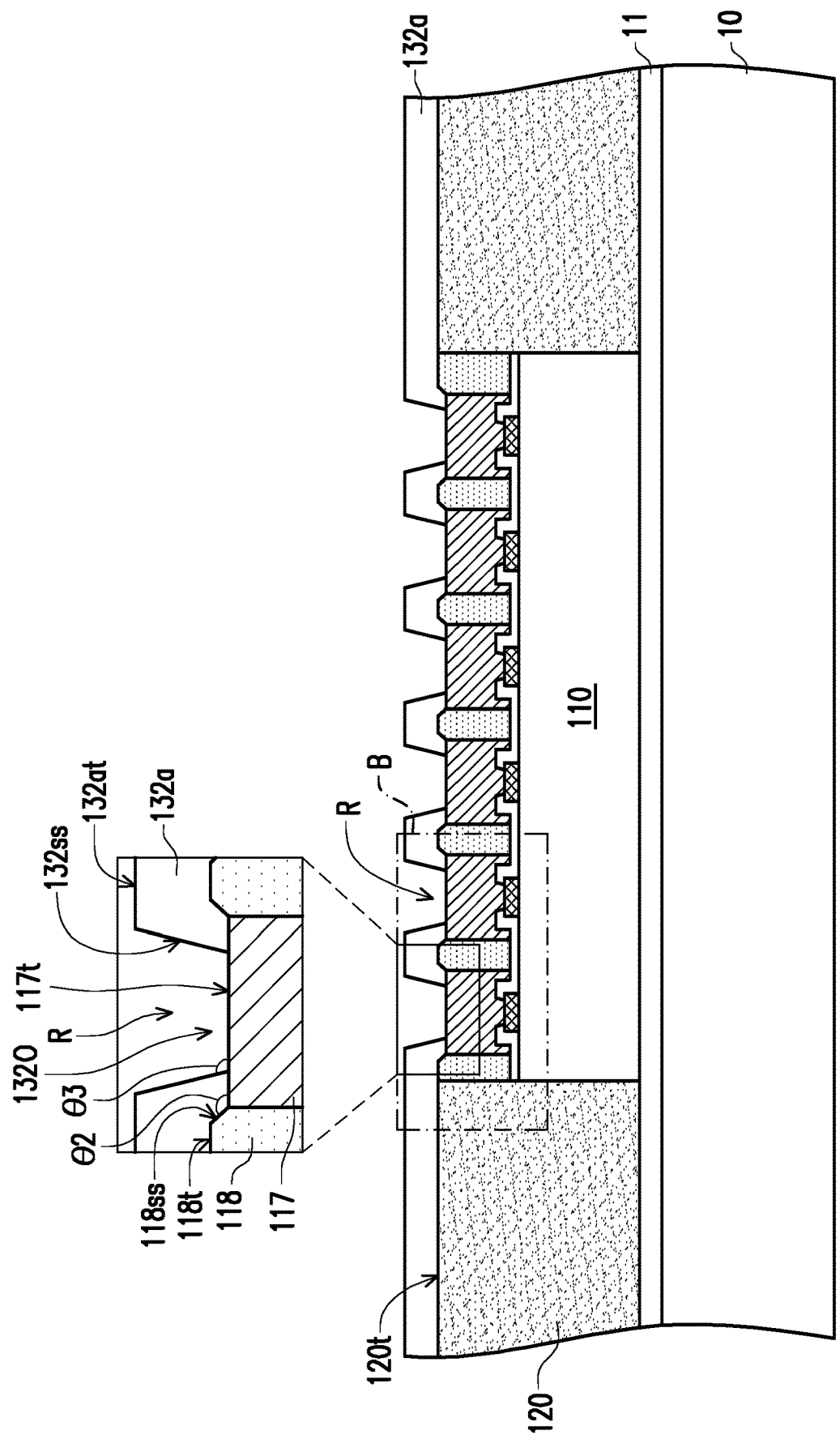
Figure 7B:
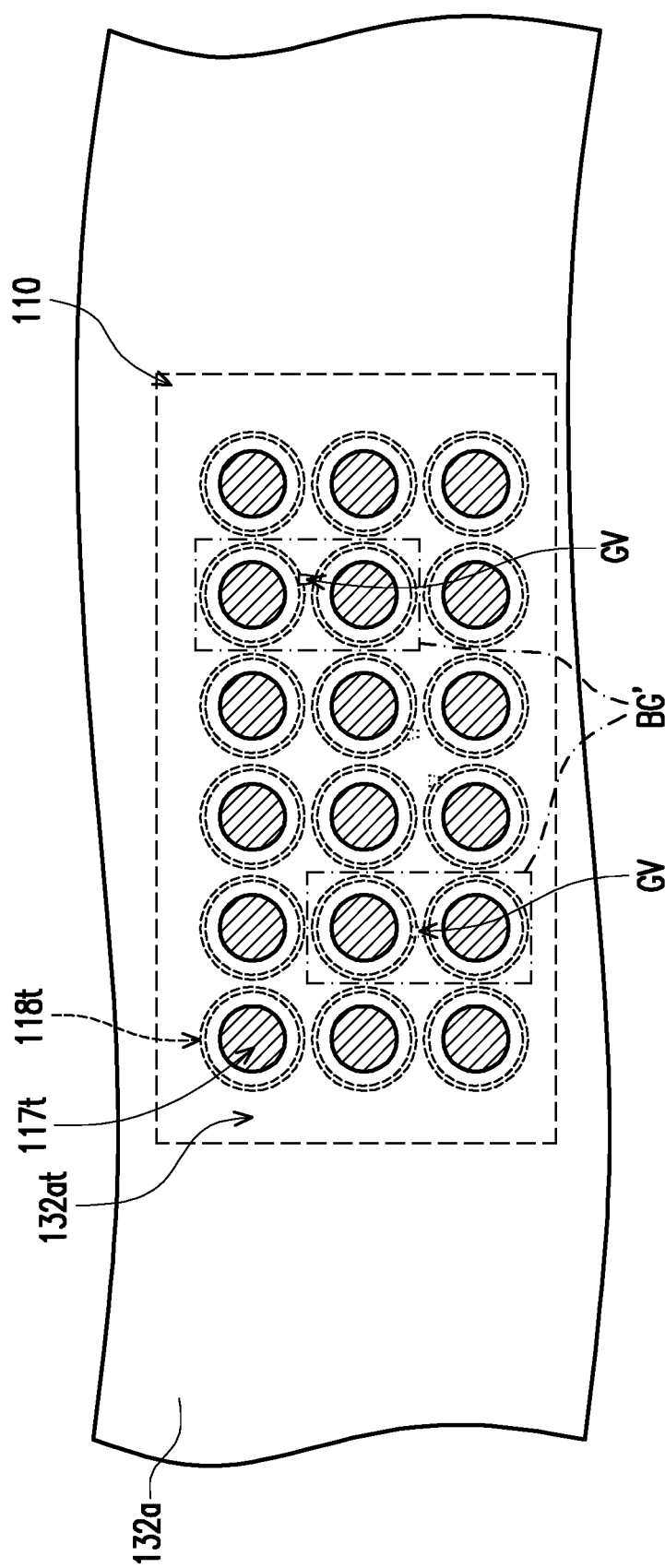
FIG. 7B is a schematic top view of FIG. 7A in accordance with some embodiments.
Figure 8:
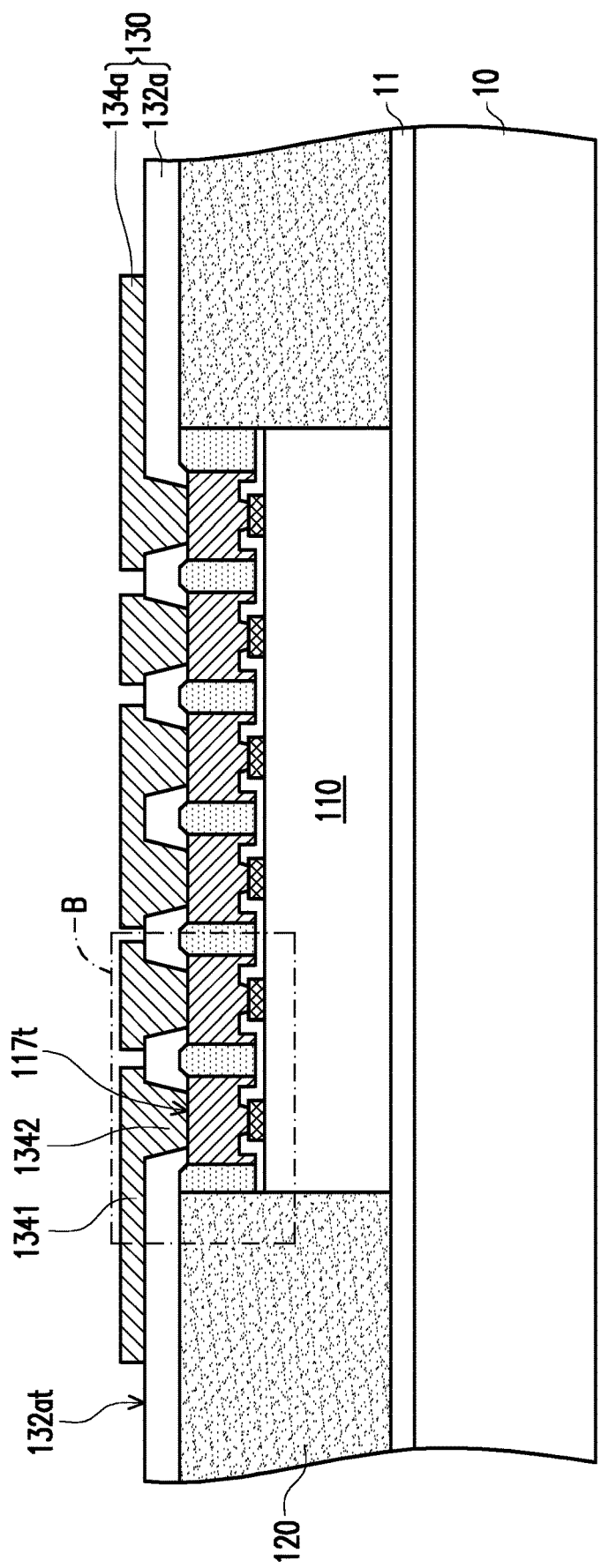

Referring to FIGS. 7A, 7B, and 8, a redistribution structure 130 is formed on the semiconductor die 110 and the insulating encapsulation 120. For example, the redistribution structure 130 includes at least one patterned dielectric layer 132a and at least one patterned conductive layer 134a. In some embodiments, the patterned dielectric layer 132a is formed before forming the patterned conductive layer 134a. As shown in FIG. 7A, the patterned dielectric layer 132a is formed on the planarized top surface 120t of the insulating encapsulation 120 and the planarized top surface 118t of the dielectric layer 118. A portion of the patterned dielectric layer 132a may extend into the recess R of the dielectric layer 118 and cover along the sloped surface 118ss of the dielectric layer 118 to reach the accessible top surfaces 117t of the conductive vias 117. For example, the portion of the patterned dielectric layer 132a covers the sloped surface 118ss of the dielectric layer 118 and also covers a peripheral portion of the respective conductive vias 117. The patterned dielectric layer 132a may include a plurality of openings 132O corresponding to the recesses R. In some embodiments, each opening 132O of the patterned dielectric layer 132a corresponds to one of the recesses R of the dielectric layer 118, so that at least a portion of the respective conductive via 117 is accessibly revealed for further electrical connection.

Continues to FIGS. 7A and 7B, the openings 132O of the patterned dielectric layer 132a may have a tapered profile. For example, the patterned dielectric layer 132a includes a top surface 132at and a sloped surface 132ss, where the sloped surface 132ss is connected to the top surface 132at and may be in physical contact with the accessible top surface 117t of the respective conductive via 117. In some embodiments, the sloped surface 132ss of the patterned dielectric layer 132a forms an angle θ3 with the accessible top surface 117t of the respective conductive via 117, where the angle θ3 therebetween may be an obtuse angle (i.e. greater than 90 degrees). In some embodiments, the patterned dielectric layer 132a conformally covers the dielectric layer 118. For example, the angle θ2 between the dielectric layer 118 and the conductive via 117 is substantially the same or similar to the angle θ3 between the patterned dielectric layer 132a and the conductive via 117. In some embodiments, the angle θ3 is less than the angle θ2. In other embodiments, the angle θ3 is greater than the angle θ2. Alternatively, the patterned dielectric layer 132 includes substantially vertical inner sidewalls that define the openings 132O.

Still referring to FIGS. 7A and 7B, the forming method of the patterned dielectric layer 132a may include at least the following steps. A dielectric material (e.g., polyimide (PI), polybenzoxazole (PBO), benzocyclobuten (BCB), or other suitable polymer material) is formed on the semiconductor die 110 and the insulating encapsulation 120 using a deposition process (e.g., spin-on coating, sputtering, and the like). Subsequently, a portion of the dielectric material may be removed to form the openings 132O using lithography (i.e. exposure and development) and/or etching processes. It is noted that other suitable techniques may be employed to form the patterned dielectric layer 132a. In some embodiments, after forming the patterned dielectric layer 132a, the grooves GV of the dielectric layer 118 are filled by the patterned dielectric layer 132a. It should be noted that the shape, size, number, and configuration of the openings of the patterned dielectric layer shown in FIG. 7B are merely an example and construe no limitation in the disclosure.

Continue to FIG. 8, the patterned conductive layer 134a is formed on the patterned dielectric layer 132a to be electrically connected to the conductive vias 117 of the semiconductor die 110. For example, the patterned conductive layer 134a includes a first portion 1341 and a second portion 1342 connected to the first portion 1341. The first portion 1341 may include conductive lines and/or conductive pads that extend on the top surface 132at of the patterned dielectric layer 132a. For example, the first portion 1341 expands wider than an area that is defined by the sidewall of the semiconductor die 110. The second portion 1342 may be vias that are formed in the openings 132O of the patterned dielectric layer 132a and lands on the conductive vias 117. For example, the second portion 1342 laterally covered by the patterned dielectric layer 132a is in physical and electrical contact with the overlying conductive material (e.g., the first portion 1341) and the underlying conductive material (e.g., the conductive vias 117). For example, the patterned conductive layer 134a is formed using patterning and metallization techniques (e.g., lithography, etching, planarization, thin-film deposition, plating on a deposited seed layer, damascene processing, etc.). In some embodiment, the abovementioned steps may be performed multiple times to obtain a multi-layered redistribution structure (e.g., shown in FIG. 9) as required by the circuit design.

In other embodiments, the patterned conductive layer is formed before the patterned dielectric layer. In such embodiments, the first portion of the patterned conductive layer extends on the planarized top surface 118t of the dielectric layer 118 and/or the planarized top surface 120t of the insulating encapsulation 120, and the second portion of the patterned conductive layer fills the recesses R of the dielectric layer 118 to be in physical and electrical contact with the conductive vias 117. The patterned dielectric layer is subsequently formed on the insulating encapsulation 120 and the semiconductor die 110 to cover the first portion of the patterned conductive layer, where the openings of the patterned dielectric layer may accessibly reveal at least a portion of the first portion of the patterned conductive layer for further electrical connection. The abovementioned steps may be performed multiple times to obtain a multi-layered redistribution structure. It should be noted that the forming sequence of the patterned dielectric layer and the patterned conductive layer construes no limitation in the disclosure.

Figure 9:
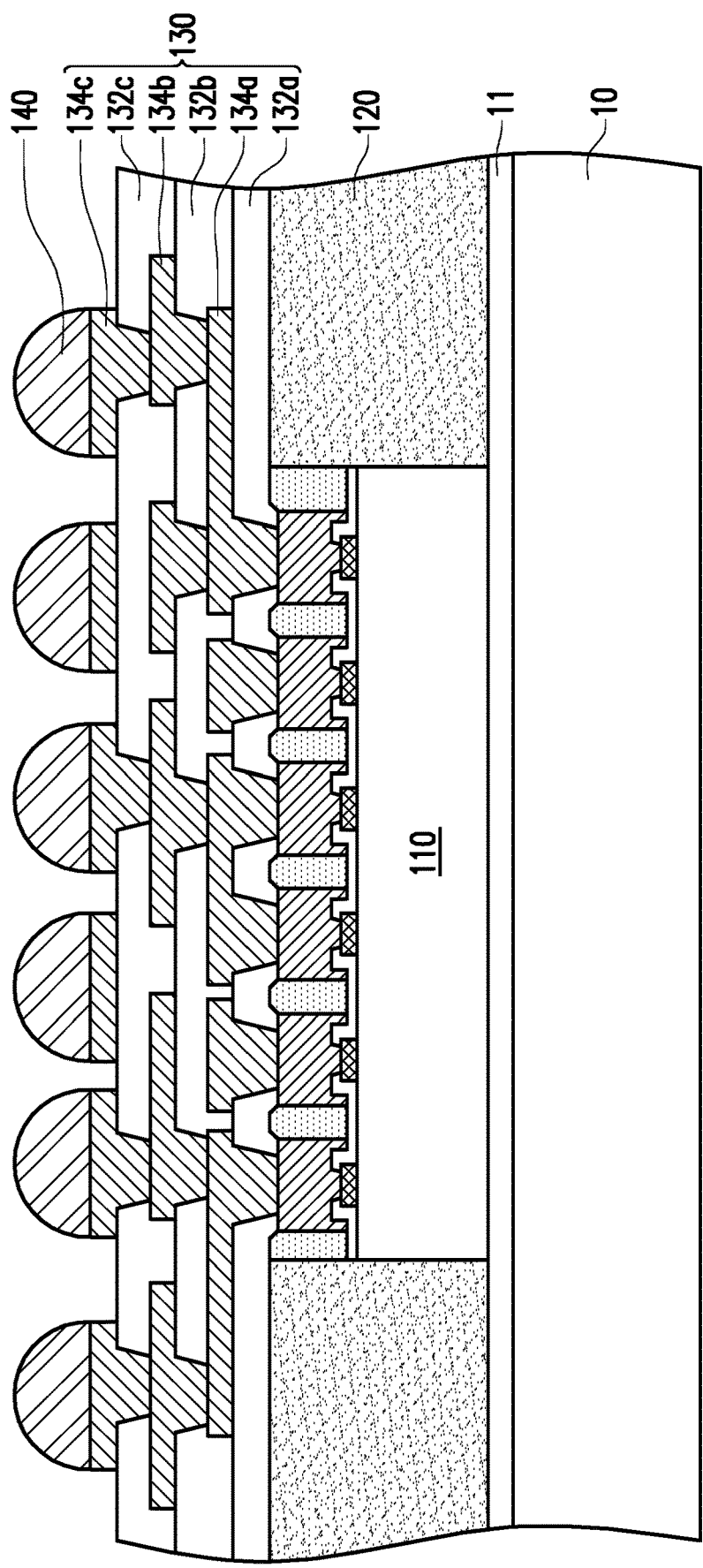

Referring to FIG. 9, after forming the redistribution structure 130, a plurality of conductive terminals 140 are formed on the redistribution structure 130. In some embodiments in which the multi-layered redistribution structure is formed, the redistribution structure 130 includes a plurality of patterned dielectric layers (e.g., 132a, 132b, and 132c) and a plurality of patterned conductive layers (e.g., 134a, 134b, and 134c) alternately stacked on the patterned dielectric layers, where the patterned conductive layers (e.g., 134a, 134b, and 134c) are electrically connected to one another. It is noted that the redistribution structure 130 illustrated herein is an example, and the numbers of the patterned dielectric layer and the patterned conductive layer may be selected to be one or more than one, based on demand. In some embodiments, the topmost one of the patterned conductive layers 134c includes a part (e.g., under-ball metallurgy (UBM) patterns) for electrically connecting with the later-formed components. In some embodiments, the conductive terminals 140 are formed on the UBM patterns of the topmost one of the patterned conductive layers 134c by a ball placement process, a plating process, or other suitable processes.

In some embodiments, the conductive terminals 140 are electrically coupled to the semiconductor die 110 through the redistribution structure 130. For example, the conductive terminals 140 include controlled collapse chip connection (C4) bumps, micro-bumps, solder balls, ball grid array (BGA) balls, or other suitable terminals for providing external connections to the semiconductor die 110. Other possible forms and shapes of the conductive terminals 140 may be utilized according to design requirements. In some embodiments, a soldering process and a reflow process are optionally performed for enhancement of the adhesion between the conductive terminals 140 and the redistribution structure 130.

Figure 10:
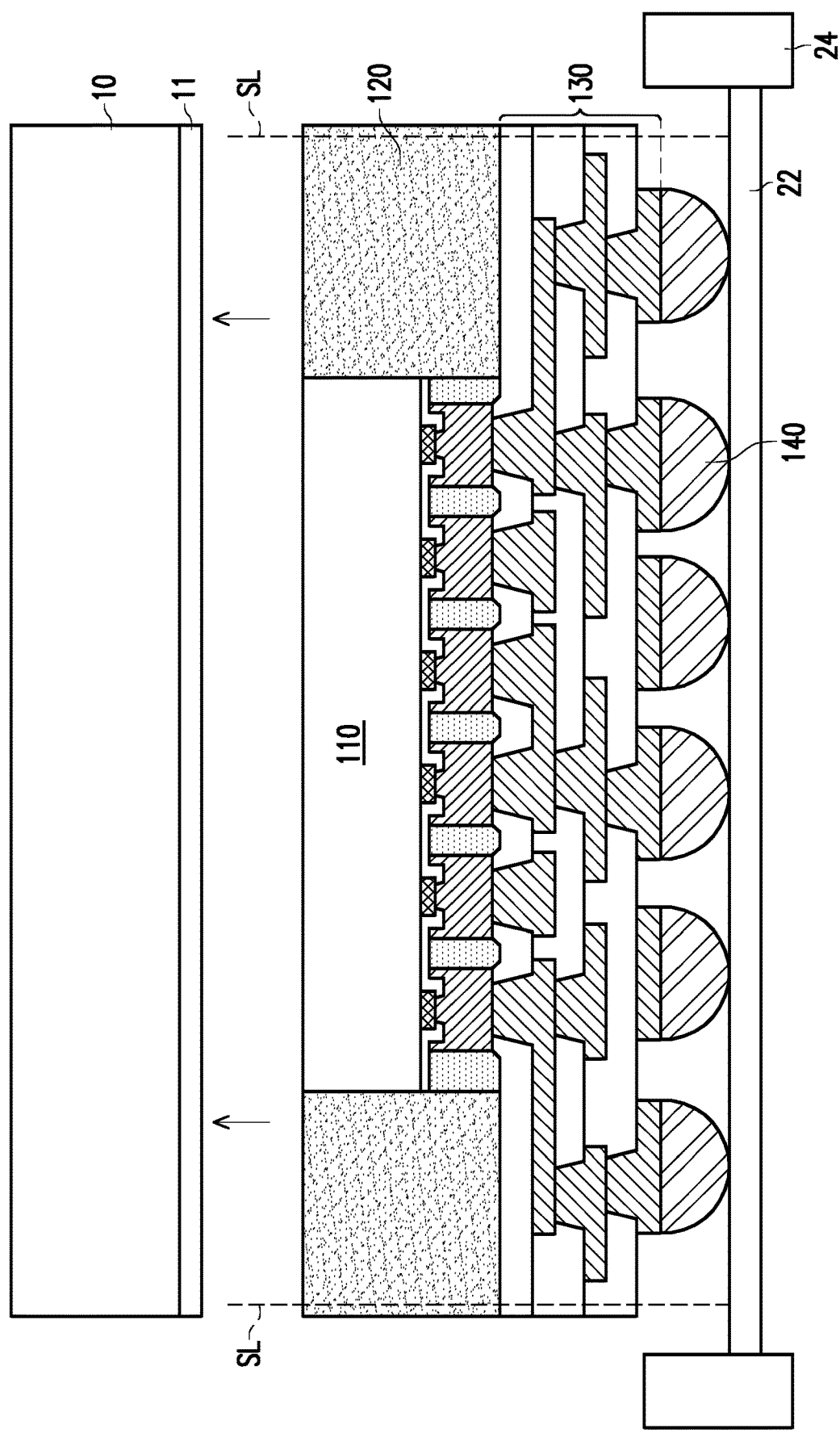
Figure 11:
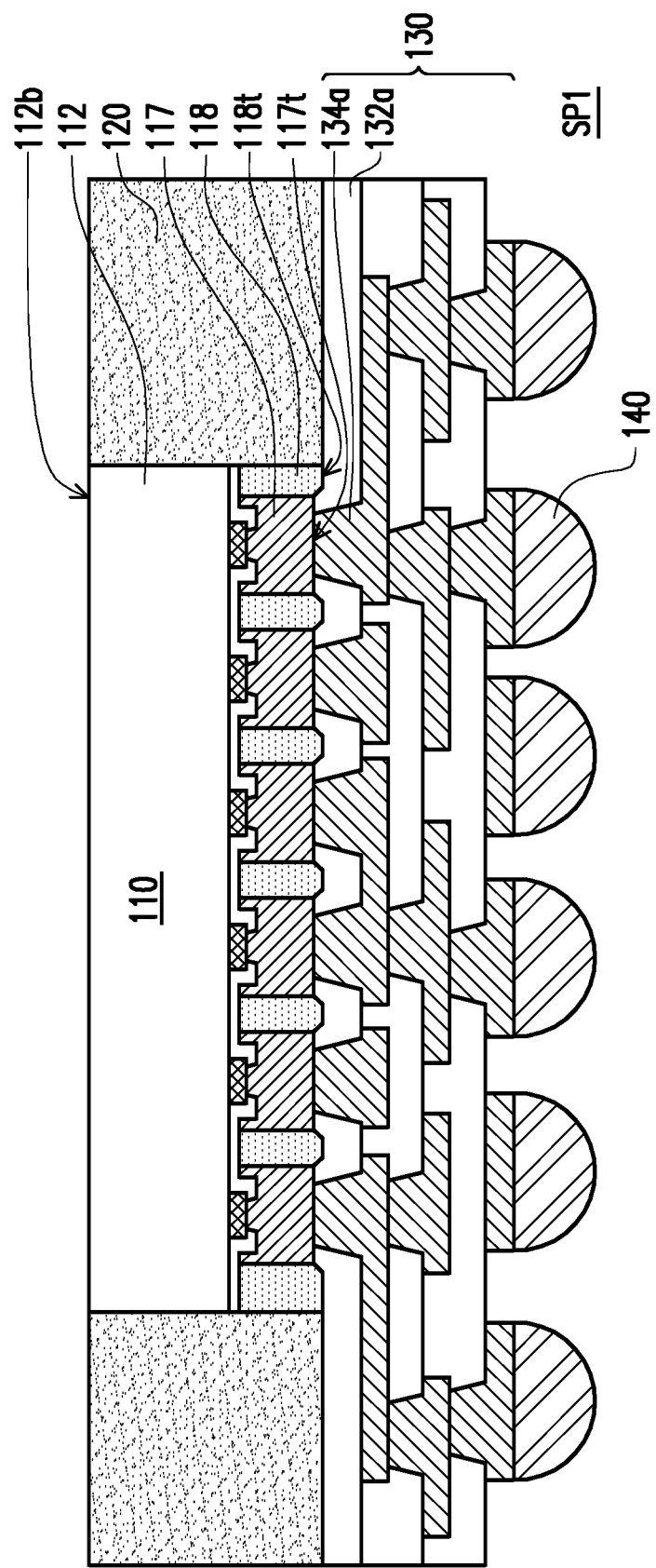

Referring to FIGS. 10 and 11, after forming the conductive terminals 140, the temporary carrier 10 is de-bonded or removed from the resulting structure. In some embodiments, the external energy such as UV laser, visible light or heat, is applied to the de-bonding layer 11 to lose its adhesiveness, so that the temporary carrier 10 may be detached from the insulating encapsulation 120 and the semiconductor die 110. Subsequently, a singulation process may be performed to form a plurality of semiconductor packages SP1. For example, a dicing tape 22 fixed by a dicing frame 24 is attached to the resulting structure to provide mechanical and structural support during the singulation. For example, a die saw (not shown) is cut along scribe lines SL to separate the semiconductor packages SP1 from one another. In some embodiments, during the singulation, the insulating encapsulation 120 and the redistribution structure 130 are cut through by the die saw. The singulated structure is then removed from the dicing tape 22. Up to here, the fabrication of the semiconductor package SP1 is substantially complete.

As shown in FIG. 11, the semiconductor package SP1 includes at least one semiconductor die 110 laterally covered by the insulating encapsulation 120, where the semiconductor die 110 includes the conductive vias 117 recessed in the dielectric layer 118. For example, the accessible top surfaces 117t of the conductive vias 117 are between the planarized top surface 118t of the dielectric layer 118 and the back surface 112b of the semiconductor substrate 112, where the front surface of the semiconductor substrate 112, the accessible top surfaces 117t of the conductive vias 117, and the planarized top surface 118t of the dielectric layer 118 face the same direction (e.g., downwardly in FIG. 11). The redistribution structure 130 is disposed on the semiconductor die 110 and the insulating encapsulation 120, a portion of the patterned dielectric layer 132a of the redistribution structure 130 extends into the semiconductor die 110 to partially cover the conductive vias 117 of the semiconductor die 110, and a portion of the patterned conductive layer 134a of the redistribution structure 130 laterally covered by the patterned dielectric layer 132a extends to be in physical and electrical contact with the conductive vias 117 of the semiconductor die 110.

In some embodiments, since the redistribution structure 130 connected to the semiconductor die 110 reroutes electrical signals of the semiconductor die 110 and expands wider than the area defined by the semiconductor die 110, the redistribution structure 130 is referred to as a fan-out redistribution structure. In some embodiments, the semiconductor device SP is referred to as an integrated fan-out (InFO) semiconductor package. For example, the configuration of conductive vias 117 recessed in the dielectric layer 118 may prevent bridging from occurring and also allow for a fine-pitched design.

Figure 12:
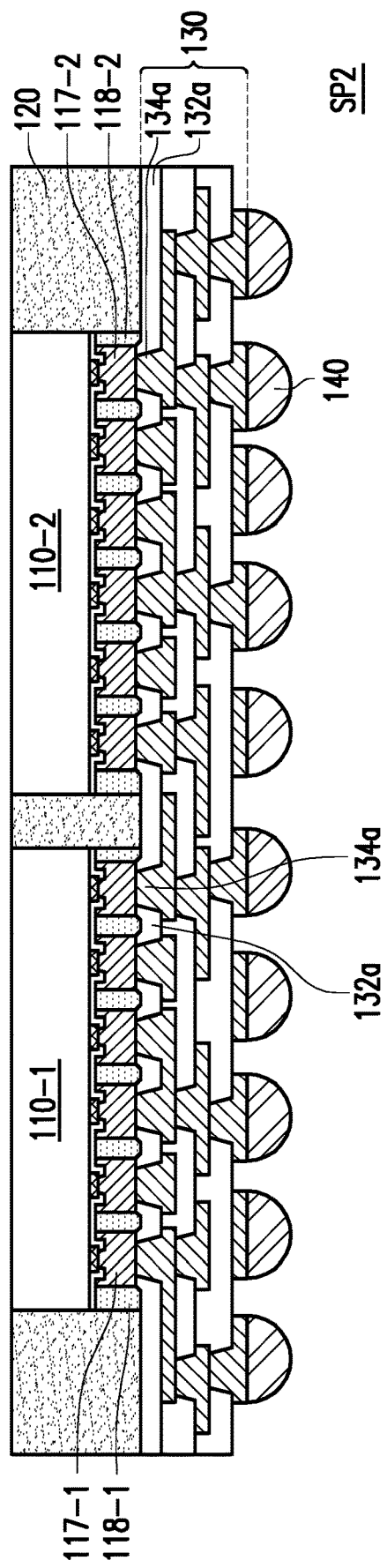
FIG. 12 is a cross-sectional view illustrating a variation of a semiconductor package in accordance with some embodiments.

FIG. 12 is a cross-sectional view illustrating a variation of a semiconductor package in accordance with some embodiments. Referring to FIG. 12, a semiconductor package SP2 is provided. The semiconductor package SP2 and the semiconductor package SP1 described in FIG. 11 may be similar, so the detailed descriptions are not repeated for the sake of brevity. In some embodiments, the semiconductor package SP2 is an InFO semiconductor package that includes a plurality of semiconductor dies (e.g., 110-1 and 110-2), and the insulating encapsulation 120 extends along the sidewalls of the semiconductor dies (e.g., 110-1 and 110-2) and may be spatially apart the semiconductor dies (e.g., 110-1 and 110-2) from one another.

In some embodiments, the semiconductor dies (e.g., 110-1 and 110-2) include substantially the same size, shape, and may have substantially the same function. In other embodiments, the semiconductor dies (e.g., 110-1 and 110-2) have different sizes, shapes, and functions. For example, the semiconductor dies (e.g., 110-1 and 110-2) include logic, memory, or other types of dies. Alternatively, the semiconductor dies (e.g., 110-1 and 110-2) include other types of functions and circuitry. At least one of the semiconductor dies (e.g., 110-1 and 110-2) includes the conductive vias (e.g., 117-1 and 117-2) that are recessed in the dielectric layer (e.g., 118-1 and 118-2). The redistribution structure 130 formed on the semiconductor dies (e.g., 110-1 and 110-2) and the insulating encapsulation 120 may include the patterned dielectric layer 132a and the patterned conductive layer 134a, where a portion of the patterned dielectric layer 132a may extend to be in direct contact with at least a portion of the conductive vias (e.g., 117-1 and 117-2) that are recessed in the dielectric layer (e.g., 118-1 and 118-2), and a portion of the patterned conductive layer 134a laterally covered by the portion of the patterned dielectric layer 132a may be in physical and electrical contact with the conductive vias (e.g., 117-1 and 117-2) that are recessed in the dielectric layer (e.g., 118-1 and 118-2).

Figure 13A:
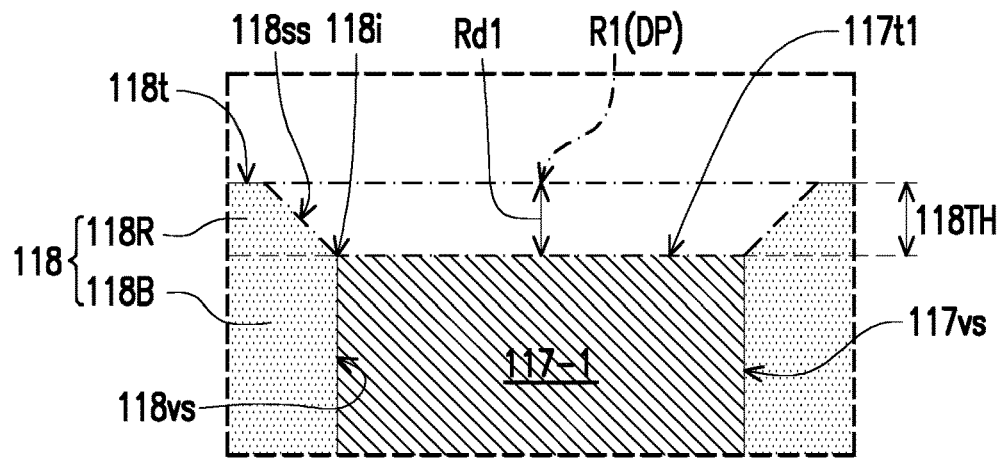
FIGS. 13A to 13C are schematic, enlarged cross-sectional views of the structure in the dashed area A outlined in FIG. 6A in accordance various embodiments.
Figure 13B:
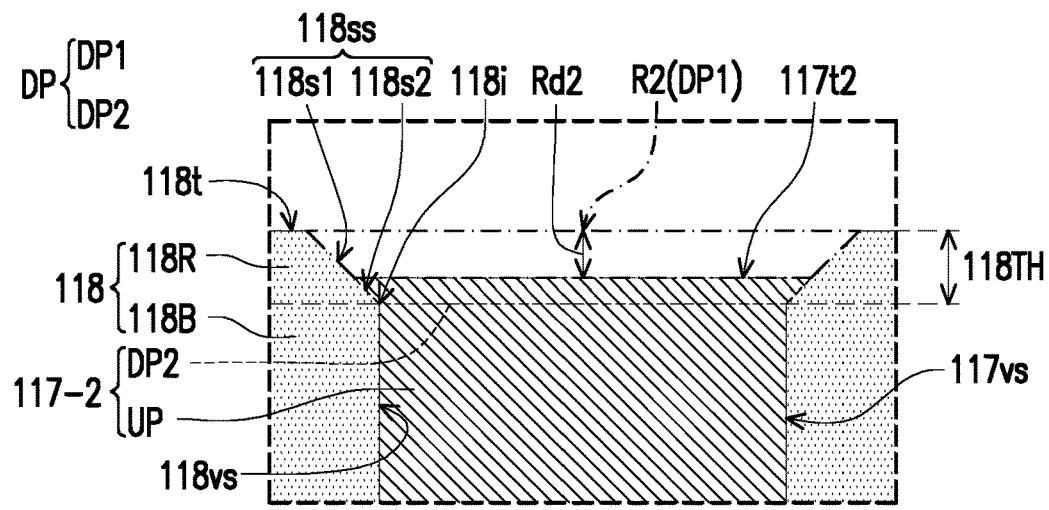
Figure 13C:
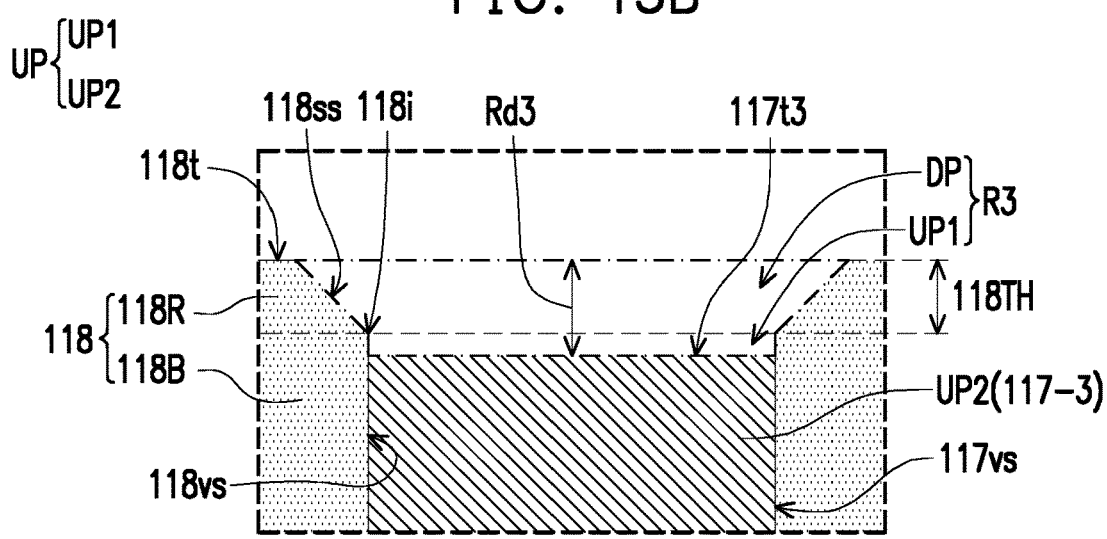

FIGS. 13A to 13C are schematic, enlarged cross-sectional views of the structure in the dashed area A outlined in FIG. 6A in accordance various embodiments. For example, an etching process is performed to remove a portion of the planarized conductive pillars 117A' (as shown in FIG. 6A). The etch depth of the planarized conductive pillars 117A' may be determined by, e.g., the etch rate, and thus the total etch time determines the etch depth of the planarized conductive pillars 117A'. It is appreciated that variations of etch depth that can result in different cross sections.

Referring to FIG. 13A, in some embodiments, the deformed portion DP of the planarized conductive pillars 117A' (shown in FIG. 5A) is removed to form the recess R1 (shown in phantom). The recess R1 may reveal the accessible top surface 117t0 of the conductive via 117-1. In some embodiments, the recess R1 includes a profile tapering in the thickness direction toward the accessible top surface 117t1 of the conductive via 117-1. For example, the maximum thickness of the conductive via 117-1 is substantially equal to the maximum thickness of the base part 118B of the dielectric layer 118. In some embodiments, the maximum depth Rd1 of the recess R1 is substantially equal to the maximum thickness 118TH of the ridge part 118R of the dielectric layer 118. For example, after removing a portion of the planarized conductive pillars 117A', the interface between the conductive via 117-1 and the dielectric layer 118 surrounding the conductive via 117-1 extends along the vertical sidewall 118vs of the dielectric layer 118 (or the vertical sidewall 117vs of the conductive via 117-1), and ends at the intersection 118i of the sloped surface 118ss of the dielectric layer 118 and the vertical sidewall 118vs of the dielectric layer 118.

Referring to FIG. 13B, in some embodiments, the deformed portion DP of the planarized conductive pillars 117A' (shown in FIG. 5A) is partially removed to form the conductive via 117-2. For example, the deformed portion DP of the planarized conductive pillars 117A' includes a sacrificial part DP1 and a remaining part DP2 connected to the sacrificial part DP1. In some embodiments, during the removing, the sacrificial part DP1 shown in phantom is etched, and the underlying portion UP and the remaining part DP2 (outlined in the dot-dashed lines) remaining on the underlying portion UP is viewed as the conductive via 117-2. In some embodiments, the accessible top surface 117t2 of the conductive via 117-2 and the sloped surface 118ss of the dielectric layer 118 intersect with each other.

For example, the sacrificial part DP1 is removed to form the recess R2 that exposes the accessible top surface 117t2 of the conductive via 117-2 and an upper part 118s1 of the sloped surface 118ss of the dielectric layer 118. In some embodiments, the recess R2 includes a profile tapering in the thickness direction toward the accessible top surface 117t2 of the conductive via 117-2. For example, the maximum thickness of the conductive via 117-2 is greater than the maximum thickness of the base part 118B of the dielectric layer 118. In some embodiments, the maximum depth Rd2 of the recess R2 is less than the maximum thickness 118TH of the ridge part 118R of the dielectric layer 118. In some embodiments, a lower part 118s2 of the sloped surface 118ss connected to the upper part 118s1 is in physical contact with the remaining part DP2 of the conductive via 117-2. For example, after the conductive via 117-2 is formed, the interface between the conductive via 117-2 and the dielectric layer 118 surrounding the conductive via 117-2 is along the vertical sidewall 118vs of the dielectric layer 118 (or along the vertical sidewall 117vs of the conductive via 117-2), and extends beyond the intersection 118i of the dielectric layer 118 to the lower part 118s2 of the sloped surface 118ss.

Referring to FIG. 13C, in some embodiments, the deformed portion DP of the planarized conductive pillars 117A' (shown in FIG. 5A) is removed, and as the removing continues, a part of the underlying portion UP (shown in FIG. 5A) is removed as well. For example, the underlying portion UP includes a sacrificial part UP1 and a remaining part UP2 connected to the sacrificial part UP. In some embodiments, during the removing, the deformed portion DP and the sacrificial part UP1 (separated in phantom) are etched, and the remaining part UP2 of the underlying portion UP is viewed as the conductive via 117-3. For example, after the removing, the deformed portion DP and the sacrificial part UP1 are removed to form the recess R3, where the accessible top surface 117t3 of the conductive via 117-3, the sloped surface 118ss of the dielectric layer 118, and a portion of the vertical sidewall 118vs of the dielectric layer 118 are revealed by the recess R3. In some embodiments, the recess R3 includes a composite profile. For example, the recess R3 includes a tapering profile at the top and a column-shaped profile at the bottom. The recess R3 may take various forms, and the illustration herein is an example. For example, the maximum thickness of the conductive via 117-3 is less than the maximum thickness of the base part 118B of the dielectric layer 118. In some embodiments, the maximum depth Rd3 of the recess R3 is greater than the maximum thickness 118TH of the ridge part 118R of the dielectric layer 118.

In some embodiments, the accessible top surface 117t3 of the conductive via 117-3 and the vertical sidewall 118vs of the dielectric layer 118 intersect with each other. The intersection point of the accessible top surface 117t3 of the conductive via 117-3 and the vertical sidewall 118vs of the dielectric layer 118 is below the intersection 118i of the dielectric layer 118. For example, after the conductive via 117-3 is formed, the interface between the conductive via 117-3 and the dielectric layer 118 surrounding the conductive via 117-3 extends along the vertical sidewall 118vs of the dielectric layer 118 (or along the vertical sidewall 117vs of the conductive via 117-3) and not across the intersection 118i of the sloped surface 118ss of the dielectric layer 118 and the vertical sidewall 118vs of the dielectric layer 118.

FIGS. 14A to 14D are schematic, enlarged cross-sectional views of partial stages of manufacturing a variation of a semiconductor package in accordance with some embodiments. For example, the manufacturing method of the semiconductor package described below is similar to the manufacturing method described in FIGS. 2-5A, 6A, 7A and 8-11, and the detailed description may be simplified or omitted for the sake of brevity. FIGS. 14A to 14D show various stages during fabrication and correspond to the enlarged cross-sectional views respectively outlined in the dashed area B of FIGS. 5A, 6A, 7A, and 8.

Figure 14A:
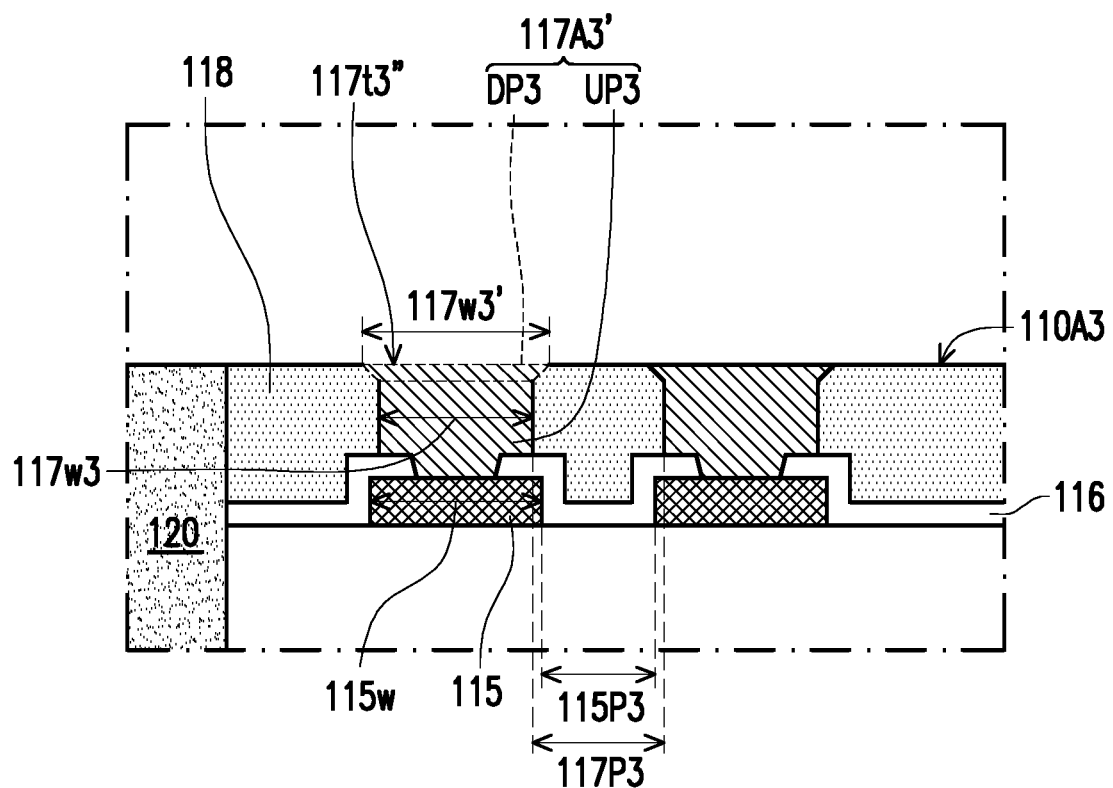
FIGS. 14A to 14D are schematic, enlarged cross-sectional views of partial stages of manufacturing a variation of a semiconductor package in accordance with some embodiments.

Referring to FIG. 14A, after performing the planarization process (e.g., described in FIGS. 4, 5A and 5B), the semiconductor die 110A3 is substantially leveled with the insulating encapsulation 120 that extends along the sidewall of the semiconductor die 110A3. For example, the difference between the semiconductor die 110A3 and the semiconductor die 110A described above includes the relative sizes of the planarized conductive pillar 117A3' and the corresponding conductive pad 115. For example, the maximum width (or diameter) 117w of the underlying portion UP3 of the planarized conductive pillar 117A3' is less than the maximum width 115w of the underlying conductive pad 115. In some embodiments, the maximum width 117w of the underlying portion UP3 of the planarized conductive pillar 117A3' is greater than the corresponding opening of the passivation layer 116, but less than the maximum width 115w of the underlying conductive pad 115. In some embodiments, the spacing 117P3 between adjacent planarized conductive pillars 117A3' is greater than the spacing 115P3 between adjacent conductive pads 115 that correspond to the adjacent planarized conductive pillars 117A3'.

In some embodiments, after performing the planarization process, the top width (or diameter) 117w3' of the planarized top surface 117t3" of the deformed portion DP3 is greater than the maximum width 117w of the underlying portion UP3. In some embodiments, the top width 117w3' of the planarized top surface 117t3" of the deformed portion DP3 is greater than the maximum width 115w of the underlying conductive pad 115. Alternatively, the top width 117w3' of the planarized top surface 117t3" of the deformed portion DP3 is substantially equal to or less than the maximum width 115w of the underlying conductive pad 115.

Figure 14B:
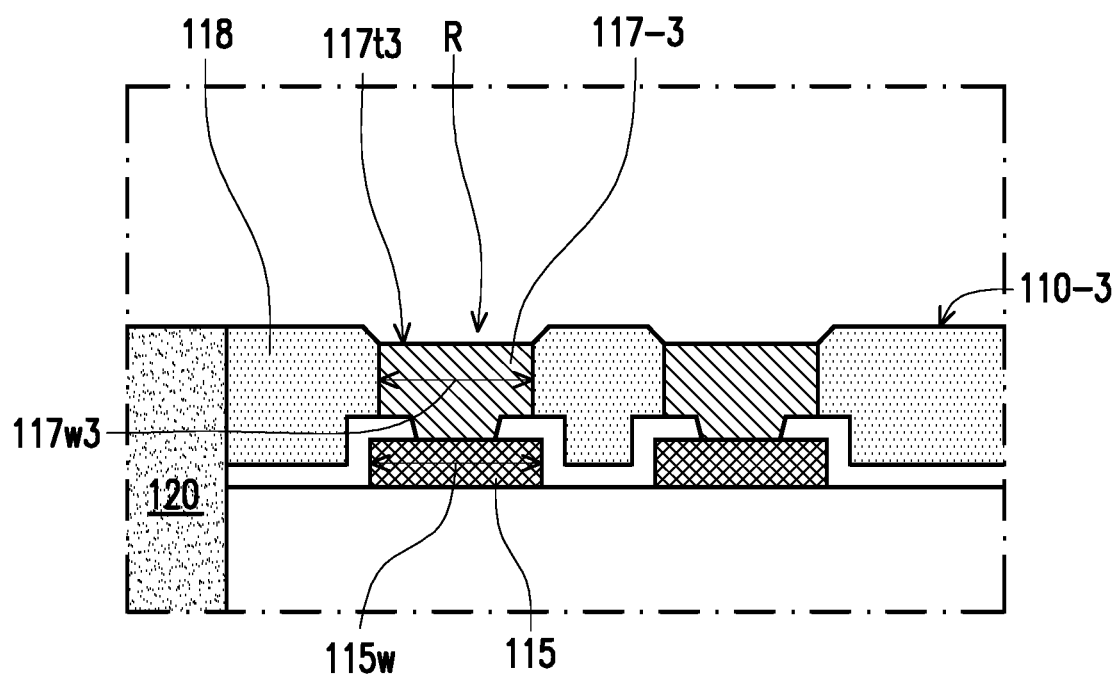

Referring to FIG. 14B, after the planarization, a portion of the respective planarized conductive pillar 117A3' is removed to form a semiconductor die 110-3 including the conductive vias 117-3 that are recessed in the dielectric layer 118. The removing process may be similar to the process described in FIGS. 6A and 6B. In some embodiments, after the removing, the accessible top surfaces 117t3 of the conductive vias 117-3 that are revealed by the recess R of the dielectric layer 118 are formed. For example, the top width 117w3 of the accessible top surfaces 117t3 of the conductive vias 117-3 is less than the maximum width 115w of the underlying conductive pad 115. Removing a portion of the conductive pillars that are bridged together or deformed may permit a finer pitch and/or a reliable spacing between adjacent conductive vias 117-3.

Figure 14C:
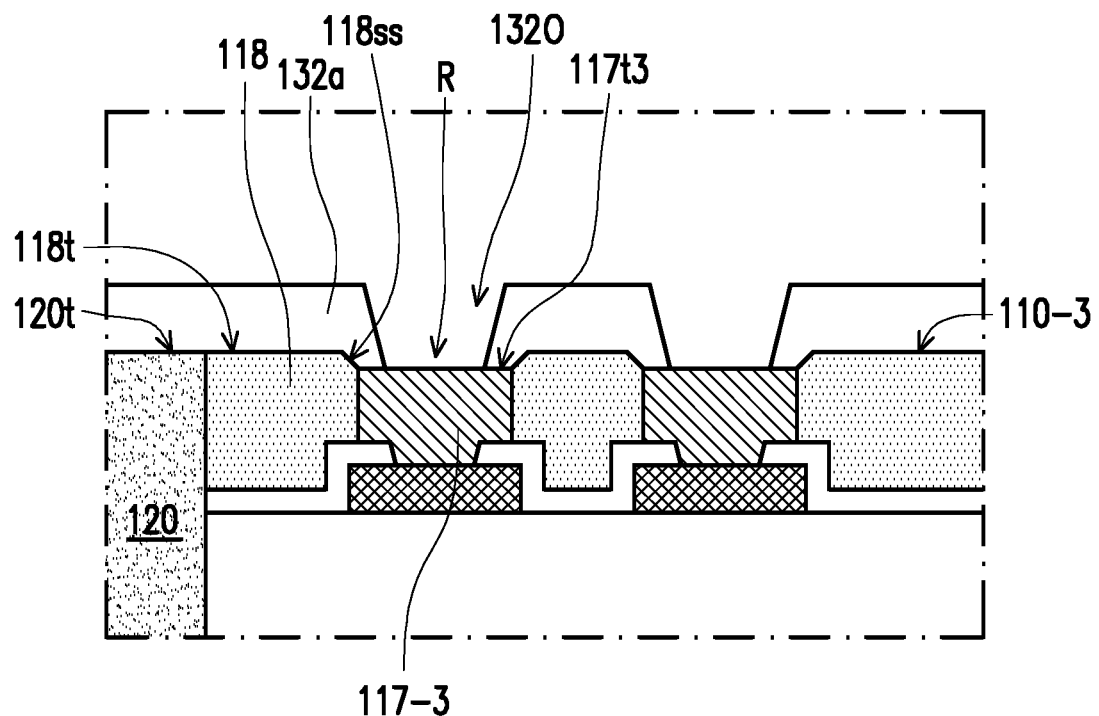
Figure 14D:
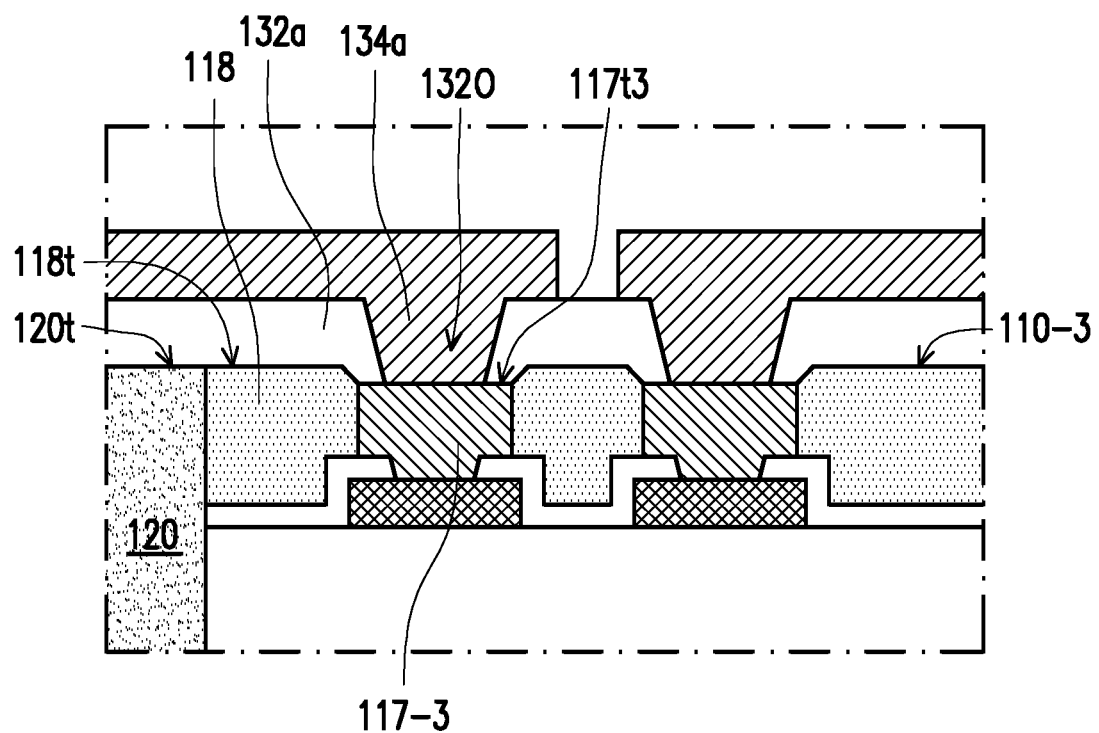

Referring to FIGS. 14C and 14D, after forming the conductive vias 117-3, the patterned dielectric layer 132a and the patterned conductive layer 134a of the redistribution structure 130 are formed on the planarized top surface 120t of the insulating encapsulation 120 and the planarized top surface 118t of the dielectric layer 118. A portion of the patterned dielectric layer 132a may extend into the recess R along the sloped surface 118ss of the dielectric layer 118 so as to be in physical contact with a portion of the respective conductive via 117-3. For example, the portion of the patterned dielectric layer 132a covers the periphery of the accessible top surface 117t3 of the respective conductive via 117-3. The openings 132O of the patterned dielectric layer 132a may correspond to and be in communication with the recesses R of the dielectric layer 118, so that at least a portion of the accessible top surface 117t3 of the respective conductive via 117-3 is accessibly revealed by the dielectric layer 118 and the patterned dielectric layer 132a. The patterned conductive layer 134a may be subsequently formed on the patterned dielectric layer 132a, and a portion of the patterned conductive layer 134a may formed in the openings 132O of the patterned dielectric layer 132a to be in physical and electrical contact with the conductive vias 117-3. The forming process may be similar to the process described in FIGS. 7A, 7B, and 8.

Figure 15:
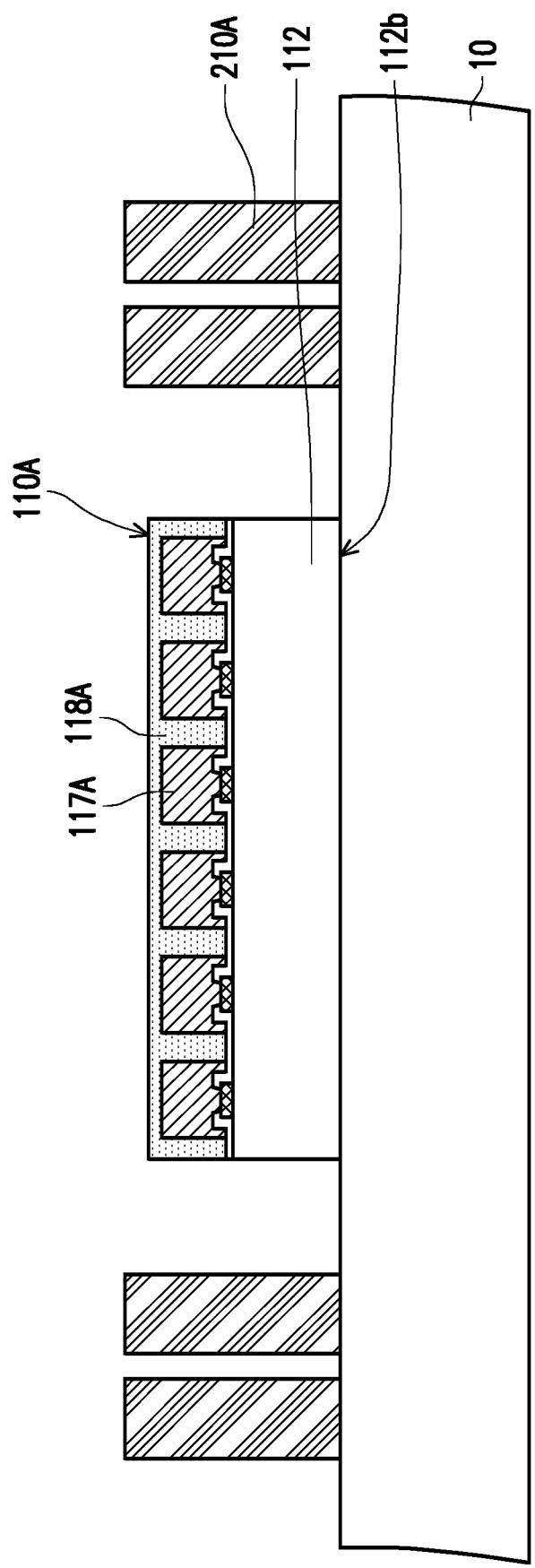
FIGS. 15 to 21 are schematic cross-sectional views of various stages of manufacturing a semiconductor package in accordance with some embodiments.

FIGS. 15 to 21 are schematic cross-sectional views of various stages of manufacturing a semiconductor package in accordance with some embodiments. Referring to FIG. 15, at least one through via material 210A is formed over the temporary carrier 10 and the semiconductor die 110A is disposed over the temporary carrier 10 and aside the through via material 210A. In some embodiments, a plurality of through via materials 210A is formed and surrounds the semiconductor die 110A.

For example, the manufacturing method of through via materials 210A includes at least the following step. A patterned photoresist with openings (not shown) may be formed on a seed layer (not shown) that is deposited over the temporary carrier 10. For example, photoresist material may be formed, and then portions of photoresist material may be exposed using a photomask (not shown). Exposed or unexposed portions of photoresist material are then removed depending on whether a negative or positive resist is used. The resulting patterned photoresist may include openings, through which portions of the seed layer are exposed. Subsequently, conductive material (e.g., copper, aluminum, silver, gold, tungsten, combinations thereof, and the like) is formed in the openings of the patterned photoresist by, for example, plating, sputtering, or the like. In some embodiments, the conductive material overfills the openings of the patterned photoresist, and a CMP process may be performed to remove excess portions of the conductive material over the patterned photoresist. The patterned photoresist is then removed by, for example, ashing, stripping, or the like. After removing the patterned photoresist, the portions of seed layer that are covered by the patterned photoresist are exposed. Next, the exposed portions of seed layer are removed by, for example, an anisotropic or isotropic etching, or the like. The remaining seed layer and the overlying conductive material may be viewed as the through via materials 210A. It is appreciated that other suitable techniques may be used to form the through via materials 210A.

In some embodiments, the semiconductor die 110A is disposed over the temporary carrier 10 after forming the through via materials 210A. For example, the semiconductor die 110A may be singulated from a device wafer, and then a pick-and-place process is performed to place the respective semiconductor die 110 on the temporary carrier 10. In some embodiments, the back surface 112b of the semiconductor substrate 112 is attached to the temporary carrier through a die attach film (not shown). At this stage, the conductive pillars 117A are buried in the dielectric material 118A. The semiconductor die 110A is similar to the semiconductor die 110A described in FIG. 2, so the detailed descriptions are omitted for the sake of brevity.

Figure 16:
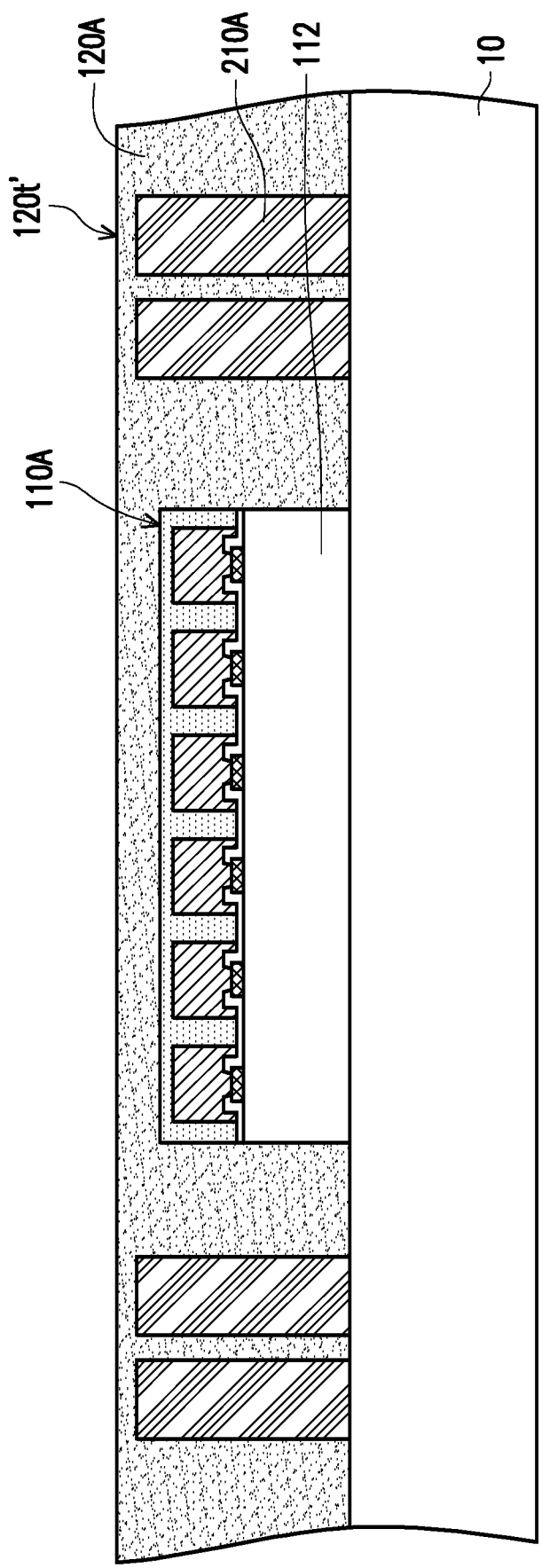

Referring to FIG. 16, an insulating material 120A is formed over the temporary carrier 10 to encapsulate the semiconductor die 110A and the through via materials 210A. In some embodiments, the semiconductor die 110A and the through via materials 210A are over-molded by the insulating material 120A. For example, the insulating material 120A covers the top surface of the semiconductor die 110A and the top surfaces of the through via materials 210A. The material and the forming process of the insulating material 120A may be similar to those of the insulating material 120A described in FIG. 3, so the detailed descriptions are omitted for the sake of brevity.

Figure 17:
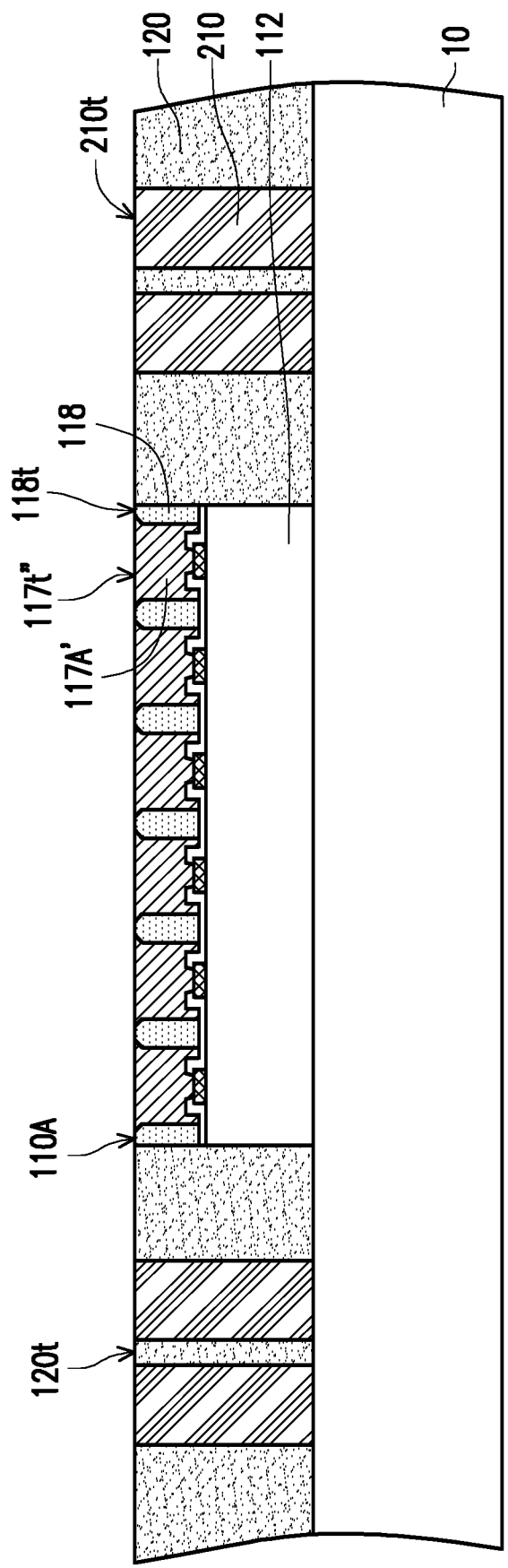

Referring to FIG. 17, a planarization process is performed to remove a portion of the insulating material 120A. In some embodiments, at least a portion of the conductive pillars 117A of the semiconductor die 110A and at least a portion of the through via materials 210A are thus accessibly revealed as a result of the planarization. In some embodiments, during the planarization, portions of the dielectric material 118A and the insulating material 120A that are over the conductive pillars 117A are removed, and portions of the insulating material 120A that are over the top surfaces of the through vias 210A are removed. After the planarization, the insulating encapsulation 120, the dielectric layer 118, the planarized conductive pillars 117A', and the through vias 210 are formed, where the insulating encapsulation 120 extends along the sidewalls of the through vias 210 and the sidewalls of the semiconductor die 110A. For example, the planarized top surfaces 117t'' of the planarized conductive pillars 117A' are substantially leveled (e.g. coplanar) with the planarized top surface 118t of the dielectric layer 118, and may be substantially leveled (e.g., coplanar) with the planarized top surface 120t of the insulating encapsulation 120 and the planarized top surfaces 210t of the through vias 210.

In some embodiments, the conductive pillars 117A that are subjected to the planarization process are deformed at tops. For example, some of the planarized conductive pillars 117A' merge together owing to the fine pitched arrangement, such that the bridging issue occurs. In some embodiments, deformation also occurs to the tops of the through vias 210 after planarization, but the spacing between neighboring through vias 210 is greater than the spacing of the conductive pillars 117A, so that undesired bridging issues may not occur to the through vias 210. The planarization process may be similar to the process described in FIGS. 4 and 5A-5B, so the detailed descriptions are omitted for the sake of brevity.

Figure 18:
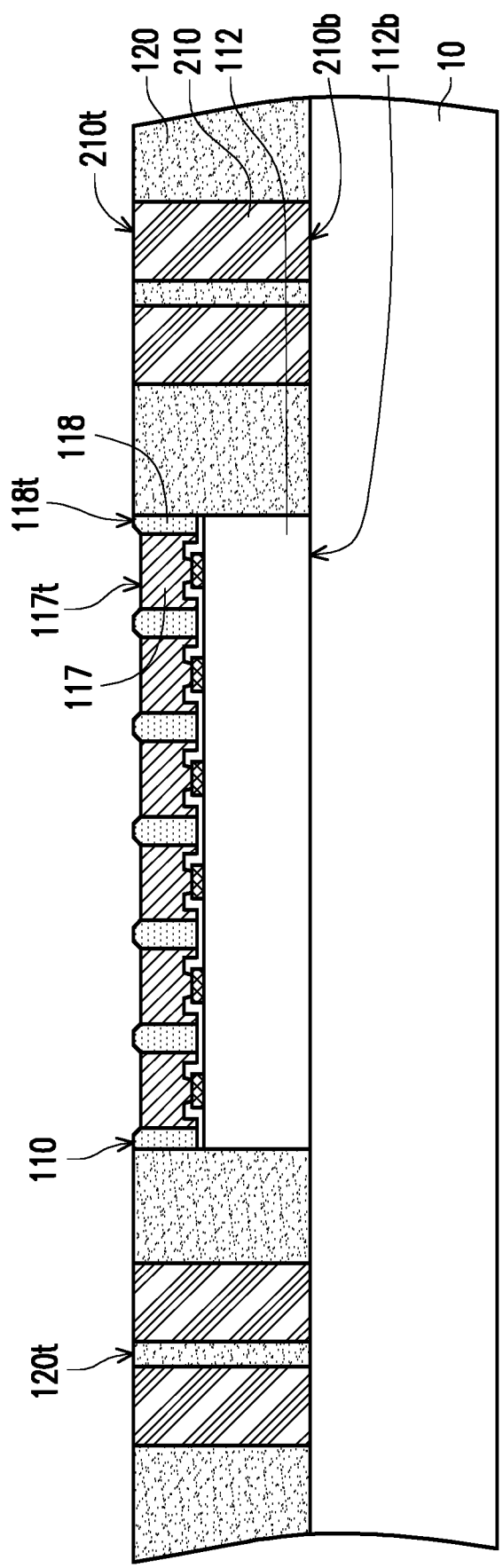

Referring to FIG. 18, after the planarization, a portion of the respective planarized conductive pillar 117A' is removed to form a conductive via 117 including the accessible top surface 117t. At this stage, the semiconductor die 110 including recessed conductive vias is formed. The portion of the respective planarized conductive pillar 117A' to be removed may include at least a portion of the deformation portion of the respective planarized conductive pillar 117A'. The removing process of the planarized conductive pillars 117A' may be similar to the process described in FIGS. 6A-6B, so the detailed descriptions are omitted for the sake of brevity. After the removing, undesired bridging issues of the planarized conductive pillar 117A' are eliminated. For example, the accessible top surfaces 117t of the conductive vias 117 are non-coplanar with the planarized top surface 118t of the dielectric layer 118, the planarized top surface 120t of the insulating encapsulation 120, and the planarized top surfaces 210t of the through vias 210. In some embodiments, the accessible top surfaces 117t of the conductive vias 117 are between the planarized top surface 118t of the dielectric layer 118 and the back surface 112b of the semiconductor substrate 112. In some embodiments, the accessible top surfaces 117t of the conductive vias 117 are lower than the planarized top surfaces 210t of the through vias 210, relative to the back surfaces 210b of the through vias 210 and the back surface 112b of the semiconductor substrate 112.

Figure 19:
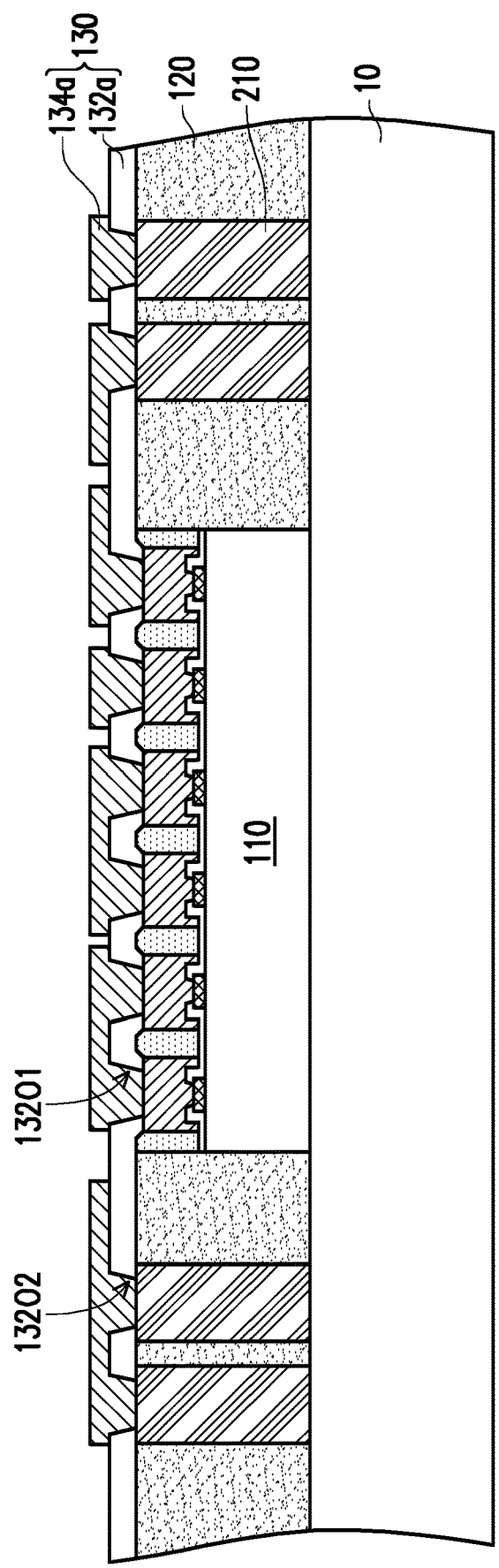

Referring to FIG. 19, the patterned dielectric layer 132a and the patterned conductive layer 134a are formed on the semiconductor die 110, the insulating encapsulation 120, and the through vias 210. For example, the patterned dielectric layer 132a includes a plurality of first openings 132O1 and a plurality of second openings 132O2, where at least a portion of the accessible top surfaces 117t of the conductive vias 117 are revealed by the first openings 132O1, and at least a portion of the planarized top surfaces 210t of the through vias 210 are revealed by the second openings 132O2. In some embodiments, each of the first openings 132O1 corresponds to one of the conductive vias 117, and each of the second opening 132O2 corresponds to one of the through vias 210. It should be noted that the shape, size, number, and configuration of the first openings 132O1 and second openings 132O2 shown in FIG. 19 are merely an example and construe no limitation in the disclosure.

The patterned conductive layer 134a may be subsequently formed on the patterned dielectric layer 132a, and portions of the conductive layer 134a extends into the first openings 132 and the second openings 132O2 to be in physical and electrical contact with the through vias 210 and the conductive vias 117, respectively. The forming processes of the patterned dielectric layer 132a and the patterned conductive layer 134a may be similar to the process described in FIGS. 7A-7B and 8, so the detailed descriptions are omitted for the sake of brevity. The abovementioned steps may be performed multiple times to obtain the redistribution structure 130 including several patterned dielectric layers and patterned conductive layers alternately stacked.

Figure 20:
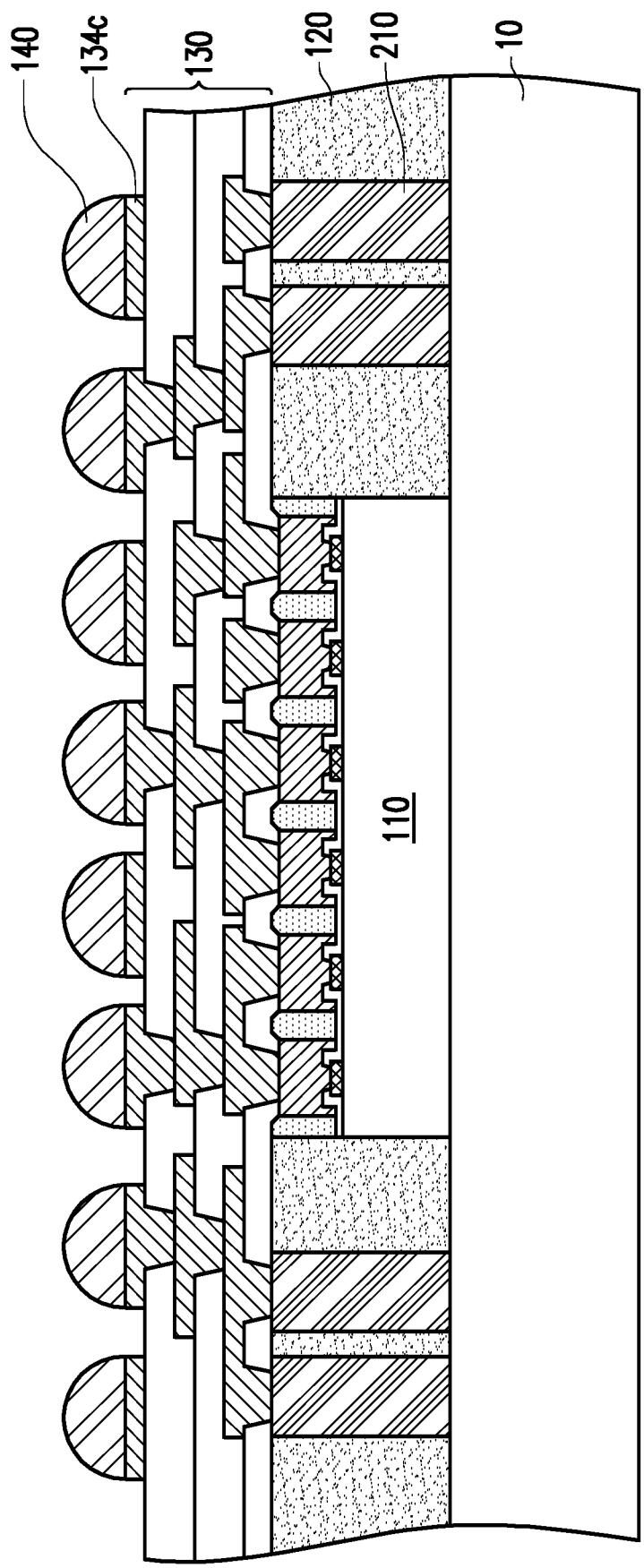

Referring to FIG. 20, the conductive terminals 140 are formed on the redistribution structure 130 to be electrically coupled to the through vias 210 and the semiconductor die 110. For example, the redistribution structure 130 is formed as the multi-layered structure, and the conductive terminals 140 are formed on the topmost one of the patterned conductive layers 134c. The material and the forming process of the conductive terminals 140 may be similar to the process described in FIG. 9, so the detailed descriptions are omitted for the sake of brevity.

Figure 21:
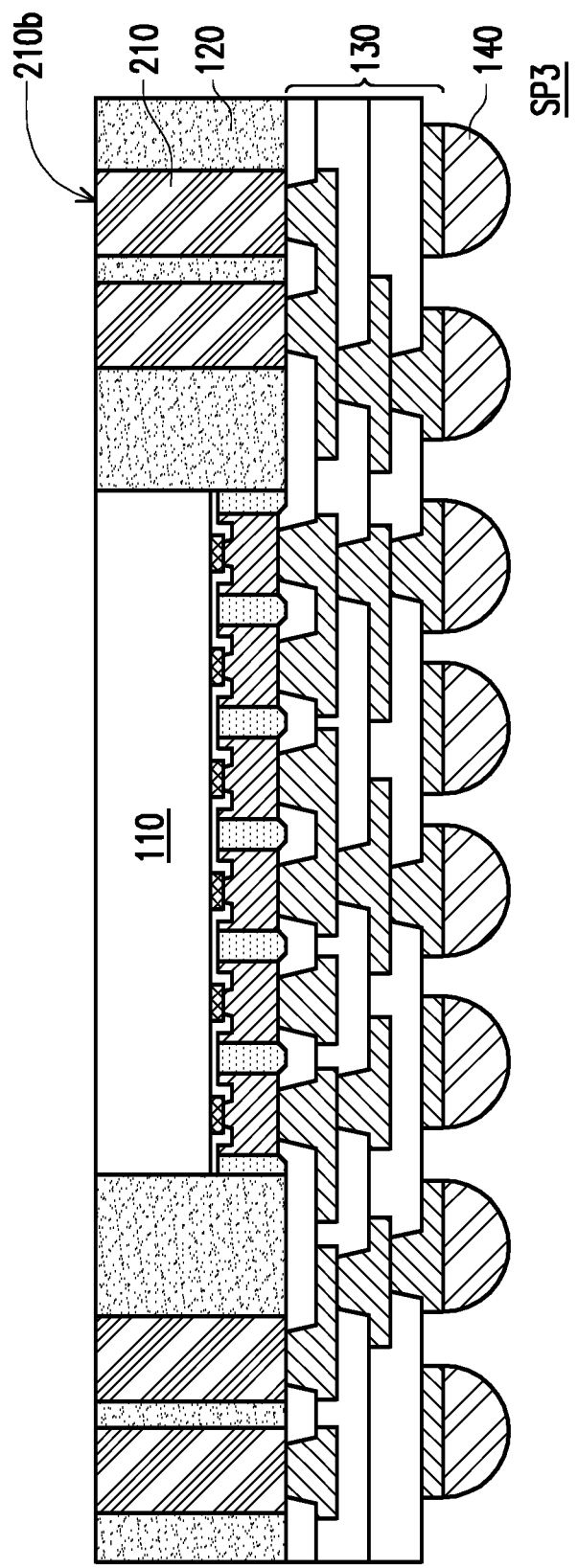

Referring to FIG. 21, after forming the conductive terminals 140, the temporary carrier 10 may be de-bonded to expose the bottom surfaces 210b of the through vias 210. The de-bonding process of the temporary carrier 10 may be similar to the process described in FIG. 10, so the detailed descriptions are omitted for the sake of brevity. In some embodiments, a singulation process is performed to cut through the insulating encapsulation 120 and the redistribution structure 130 to form an individual semiconductor package SP3. In other embodiments, additional process (e.g., stacking) is performed on the resulting structure, and the singulation may be performed after the additional process is complete.

FIGS. 22 to 26 are cross-sectional views illustrating variations and applications of a semiconductor package in accordance with some embodiments. It should be understood that the structures described and illustrated herein are merely examples, and variations thereof may be carried out while still remaining within the scope of the disclosure.

Figure 22:
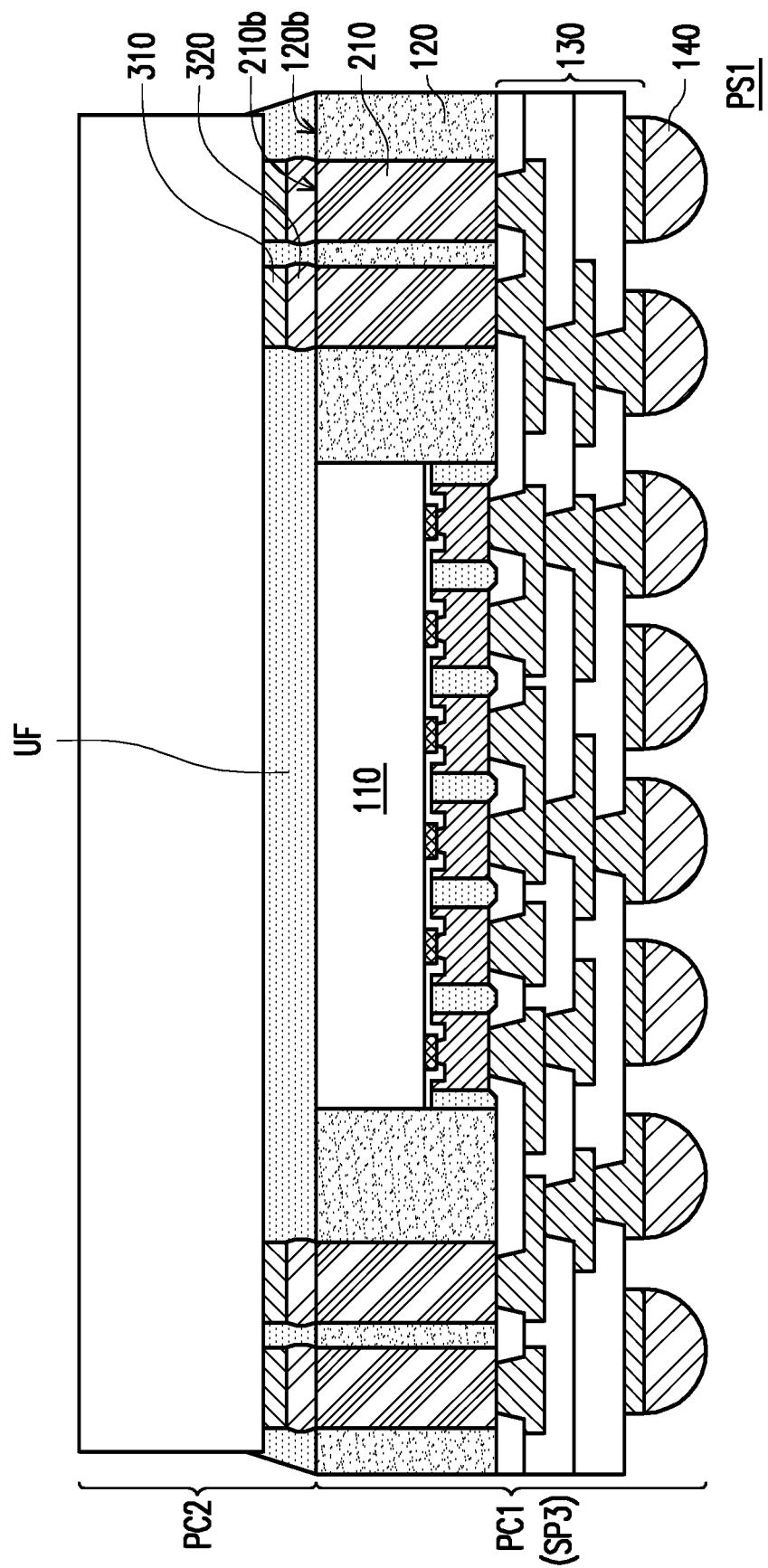
FIGS. 22 to 26 are cross-sectional views illustrating variations and applications of a semiconductor package in accordance with some embodiments.

Referring to FIG. 22, a package structure PS1 including a first package component PC1 and a second package component PC2 electrically coupled to one another is provided. In some embodiments, the second package component PC2 is stacked on the first package component PC1, and the package structure PS1 is referred to as a package-on-package (PoP) structure. In some embodiments, two or more package components are stacked in order to expand the integration ability of the semiconductor package. In some embodiments, the first package component PC1 is the semiconductor package SP3 described in FIG. 21. For example, after removing the temporary carrier 10 (described in FIG. 20), the resulting structure is sawed apart into a plurality of semiconductor packages SP3, each including at least one semiconductor die 110 and the through vias 210. The semiconductor package SP3 may be subsequently bonded to other package component to form the PoP package structure.

The second package component PC2 may include at least one semiconductor die packaged with an insulating encapsulation (not shown). In some embodiments, the second package component PC2 is similar to the semiconductor package SP1 (or SP2) described above. In some embodiments, the second package component PC2 includes a plurality of semiconductor dies in a stacked arrangement. The second package component PC2 may include a plurality of conductive pads 310 and conductive connectors 320 connected to the conductive pads 310 for external connections. In some embodiments, the conductive connectors 320 include solder bumps, copper bumps or pillars, or other connectors, and may be electrically coupled to the semiconductor die(s) of the second package component PC2 at least through the conductive pads 310. When bonding the second package component PC2 to the first package component PC1, the conductive connectors 320 of the second package component PC2 are disposed on the back surfaces 210b of the through vias 210. A reflow process is optionally performed on the conductive connectors 320 of the second package component PC2 to cause the conductive connectors 320 to reshape and bond to the through vias 210.

In some embodiments, the second package component PC2 includes high capacity/bandwidth memory die(s) (e.g., DRAM, FLASH or SRAM, wide input/out (WIO) dies, a combination of types, and the like), and the first package component PC1 includes logic die(s) (e.g., application processor (AP) die, or the like). The second package component PC2 and/or the first package component PC1 may include other heterogeneous dies (e.g., sensing dies, micro-electromechanicals (MEMs) dies, networking dies, and/or the like). With a high degree of integration, the electrical performance of the package structure PS1 may be improved benefiting from the shortened connecting paths between package components (e.g., PC1 and PC2). In some embodiments, the package structure PS1 is mounted on other package components (e.g., another device die, interposers, package substrates, printed circuit boards, a mother board, a system board, and the like) to enhance electrical performance, where the conductive terminals 140 of the semiconductor package SP3 (i.e. the first package component PC1) is disposed on the other package component.

In some embodiments, after disposing the second package component PC2 on the first package component PC1, an underfill layer UF is formed between the first package component PC1 and the second package component PC2. The conductive connectors 320 may be surrounded by the underfill layer UF, so that the underfill layer UF may provide stress relief to the conductive connectors 320. In some embodiments, a sufficient amount of the underfill layer UF fills the space between the second package component PC2 and the first package component PC1 and further climbs up to at least partially cover the sidewalls of the second package component PC2. For example, the underfill layer UF is formed by a capillary flow process, after the second package component PC2 is bonded to the first package component PC1. Other suitable techniques may be used to form the underfill layer UF. By forming the underfill layer UF, mechanical strength may be added to the package structure PS1.

Figure 23:
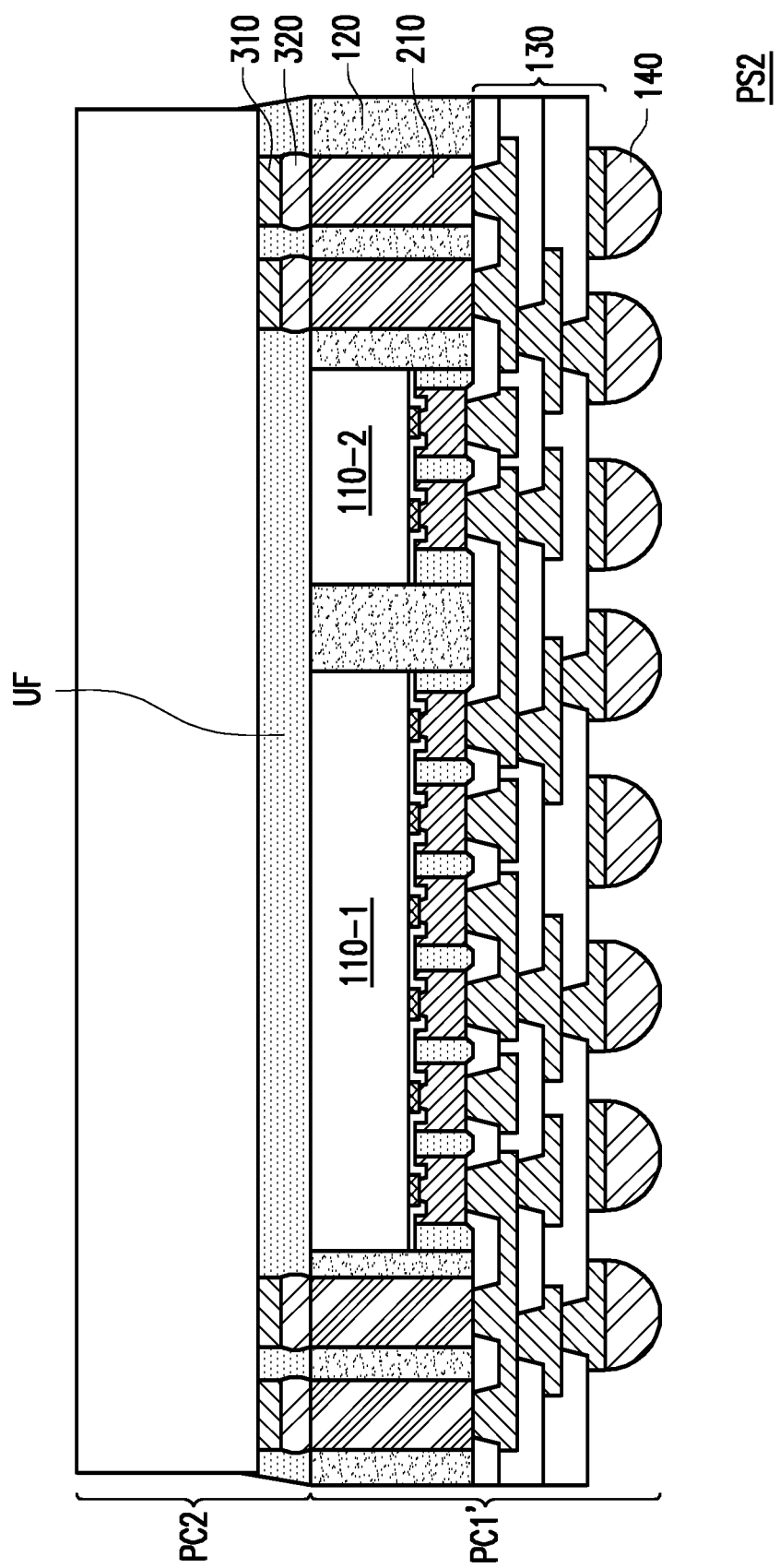

Referring to FIG. 23, a package structure PS2 including a first package component PC1' and the second package component PC2 electrically coupled to one another is provided. The package structure PS2 may be similar to the package structure PS1 described in FIG. 22, and the difference therebetween includes that the first package component PC1' includes multiple semiconductor dies (e.g., 110-1 and 110-2) disposed side by side and laterally covered by the insulating encapsulation 120. In some embodiments, the semiconductor dies (e.g., 110-1 and 110-2) are heterogeneous dies. In other embodiments, the semiconductor dies (e.g., 110-1 and 110-2) are homogeneous dies. In some embodiments, the first package component PC1' is similar to the semiconductor package SP2 described in FIG. 12, except that the first package component PC1' includes the through vias 210 surrounding the semiconductor dies (110-1 and 110-2). By the multi-die configuration, package design becomes more flexible and less complex.

Figure 24:
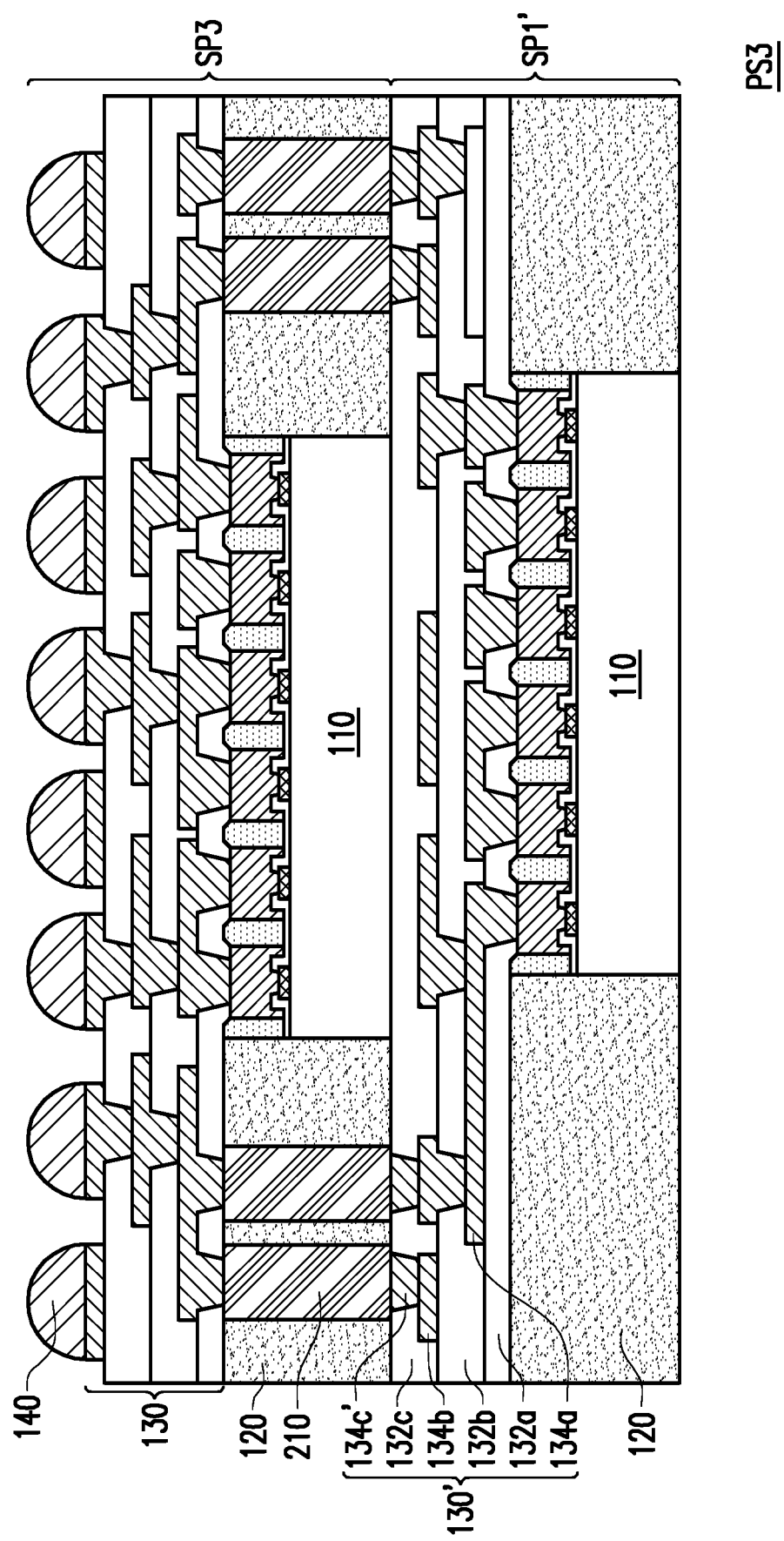

Referring to FIG. 24, a package structure PS3 including a semiconductor package SP1' and the semiconductor package SP3 formed on the semiconductor package SP1' is provided. For example, the manufacturing method of the semiconductor package SP1' is similar to the manufacturing method described in FIGS. 2-8, so the detailed descriptions are omitted for the sake of brevity. In some embodiments, when forming the redistribution structure 130' of the semiconductor package SP1', the patterned dielectric layers (e.g., 132a, 132b, and 132c) and the patterned conductive layers (e.g., 134a and 134b) are alternately formed and stacked upon one another. For example, when forming the topmost one of patterned conductive layers 134c', the via portion is formed in the openings of the topmost one of patterned dielectric layers 132c. In some embodiments, the topmost one of patterned conductive layers 134c' of the semiconductor package SP1' and the overlying through vias 210 of the semiconductor package SP3 are formed during the same process.

In some embodiments, after forming the through vias 210 on the topmost one of patterned conductive layers 134c' of the redistribution structure 130', at least one semiconductor die 110 of the semiconductor package SP3 is disposed on the topmost one of patterned dielectric layers 132c. The semiconductor die 110 of the semiconductor package SP3 and the semiconductor die 110 of the semiconductor package SP1' may be heterogeneous dies or homogeneous dies. In some embodiments, the semiconductor die 110 of the semiconductor package SP1' includes memory devices, and the semiconductor die 110 of the semiconductor package SP3 includes logic devices. Next, the insulating encapsulation 120 of the semiconductor package SP3 is formed on the topmost one of patterned dielectric layers 132c to at least laterally cover the through vias 210 and the semiconductor die 110. The redistribution structure 130 and the conductive terminals 140 of the semiconductor package SP3 may be subsequently formed. The forming processes of the insulating encapsulation 120, the redistribution structure 130, the through vias 210, and the semiconductor die 110 may be similar to the processes described in FIGS. 15-20, so the detailed descriptions are omitted for the sake of brevity. In some embodiments, after the semiconductor package SP3 is formed on the semiconductor package SP1', a singulation process is performed to cut through the semiconductor package SP1' and the semiconductor package SP3 so as to form the package structure PS3.

Figure 25:
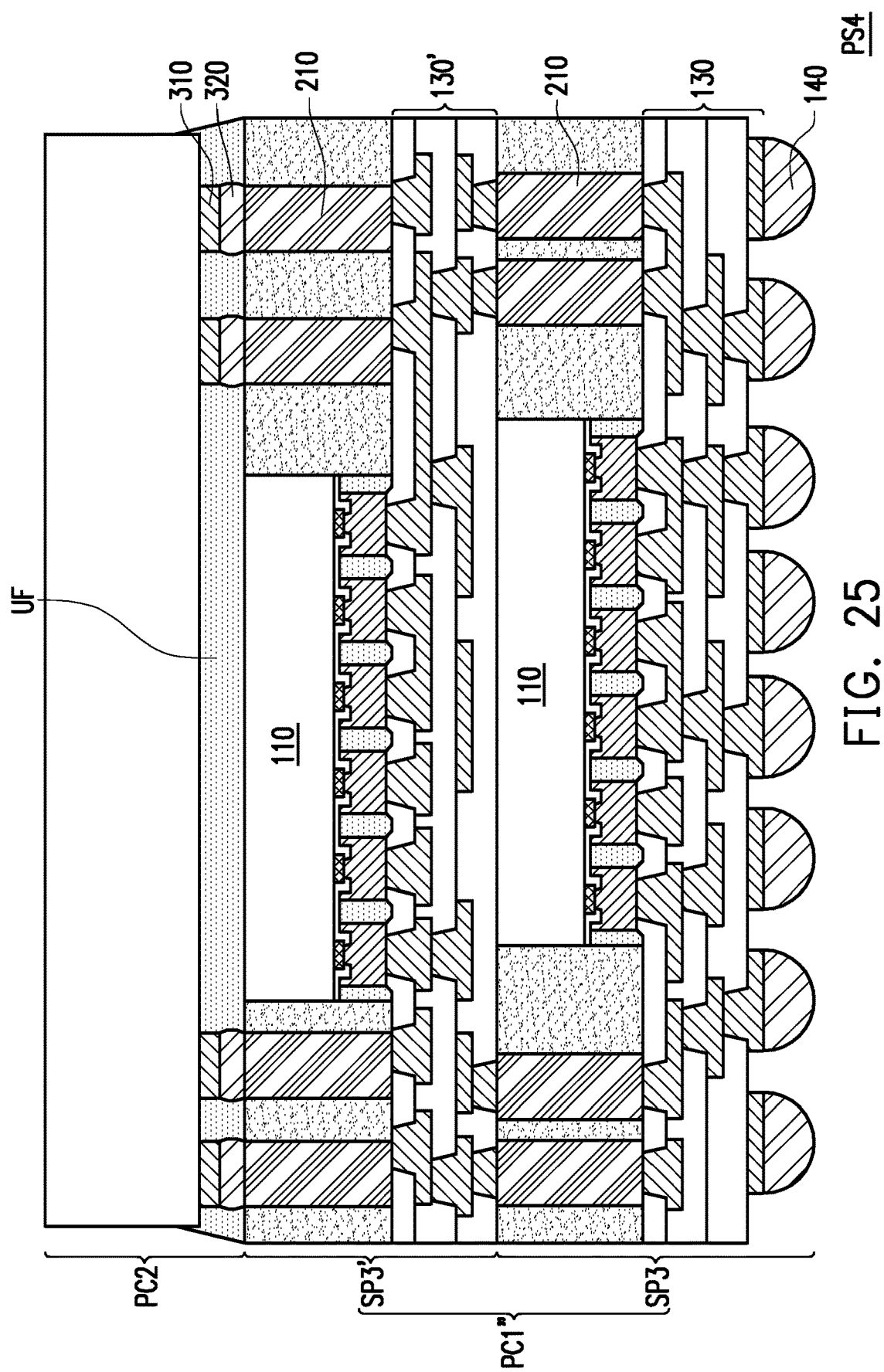

Referring to FIG. 25, a package structure PS4 including a first package component PC1" and the second package component PC2 electrically coupled to one another is provided. For example, the first package component PC1" includes the semiconductor package SP3' and the semiconductor package SP3. The forming process of the first package component PC1" may be similar to the package structure PS3 described in FIG. 24, except that the formation of the semiconductor package SP1' is replaced with the formation of the semiconductor package SP3'. For example, the difference of the forming processes of the semiconductor packages SP1' and SP3' includes that the through vias 210 of the semiconductor package SP3' are formed before forming the insulating encapsulation 210 of the semiconductor package SP3'.

In some embodiments, after the structure including the semiconductor packages SP1' and SP3' may be formed in a wafer form, and then a singulation process may be performed to form a plurality of first package components PC1". The second package component PC2 may be subsequently disposed on the semiconductor package SP3' of the first package component PC1". By forming the through vias 210 of the semiconductor package SP3', the conductive connectors 320 of the second package component PC2 may be disposed on the through vias 210 of the semiconductor package SP3', thereby providing electrical connection between the second package component PC2 and the first package component PC1". Alternatively, the second package component PC2 is disposed on the semiconductor package SP3' of the first package component PC1", and then a singulation process is performed to form the package structure PS4. In some embodiments, the underfill layer UF is disposed between the first package component PC1" and the second package component PC2. The underfill layer UF may be similar to the underfill layer UF described in FIG. 22, so the detailed descriptions are not repeated for the sake of brevity.

Figure 26:
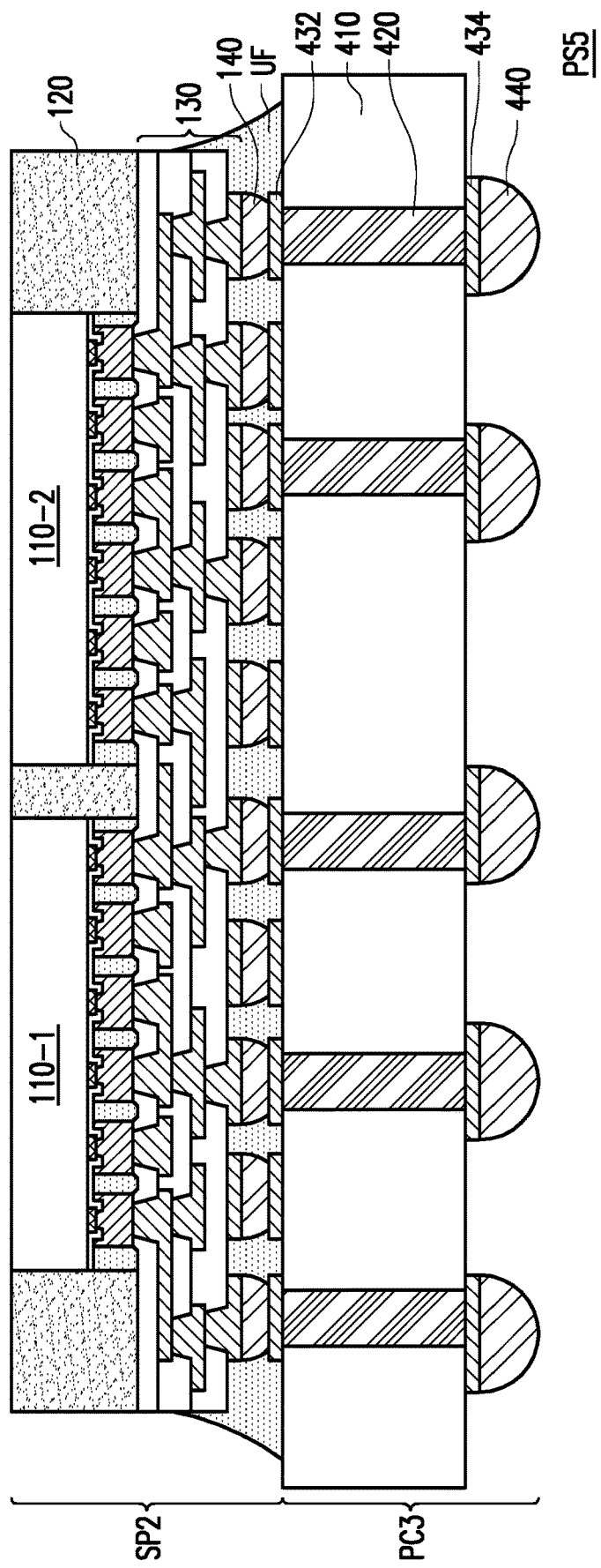

Referring to FIG. 26, a package structure PS5 including the semiconductor package SP2 and a package component PC3 electrically coupled to one another is provided. For example, the package component PC3 includes an interposer, a package substrate, a printed circuit board, a mother board, and/or the like. In some embodiments, the package component PC3 is an interposer including a core layer 410, a plurality of through core vias 420, first bond pads 432 and second bond pads 434, and external connectors 440. For example, the material of the core layer 410 includes silicon based material, circuit board materials (e.g., bismaleinide-triazine (BT) resin, FR-4), ceramic, glass, or other suitable material. In some embodiments, the first bond pads 432 and the second bond pads 434 are respectively disposed on the two opposite sides of the core layer 410, and the through core vias 420 may penetrate through the core layer 410 to be electrically connected the first bond pads 432 and the second bond pads 434. In some embodiments, the external connectors 440 (e.g., solder balls, ball grid array (BGA) balls, controlled collapse chip connector (C4) bumps, or the like) are formed on the second bond pads 434. In some embodiments, the external connectors 440 of the package component PC3 act as the electrical connectors for bonding and electrically coupling the package structure PS5 to another package component(s).

The conductive terminals 140 of the semiconductor package SP2 may be disposed on the first bond pads 432 of the package component PC3. In some embodiments, the package component PC3 is more rigid (or thicker) than the semiconductor package SP2, thereby providing mechanical stiffening to the package structure PS5. It is appreciated that the semiconductor package SP2 may be replaced with any other semiconductor package described herein while still remaining within the scope of the disclosure.

According to some embodiments, a semiconductor package includes a semiconductor die an insulating encapsulation laterally covering the semiconductor die. The semiconductor die includes a semiconductor substrate, a plurality of conductive pads distributed over the semiconductor substrate, a plurality of conductive vias disposed on and electrically connected to the conductive pads, and a dielectric layer disposed over the semiconductor substrate and spaced the conductive vias apart from one another. A sidewall of the dielectric layer extends along sidewalls of the conductive vias, the conductive vias are recessed from a top surface of the dielectric layer, and a sloped surface of the dielectric layer is connected to the top surface of the dielectric layer and the sidewall of the dielectric layer.

According to some alternative embodiments, a semiconductor package includes a semiconductor die, an insulating encapsulation laterally covering the semiconductor die, and a redistribution structure. The semiconductor die includes a semiconductor substrate includes a first surface and a second surface opposite to each other, a plurality of conductive vias distributed over the first surface of the semiconductor substrate, and a dielectric layer disposed over the first surface of the semiconductor substrate and separating the conductive vias from one another. First surfaces of the conductive vias are between a first surface of the dielectric layer and the second surface of the semiconductor substrate. The first surface of the semiconductor substrate, and the first surfaces of the conductive vias, and the first surface of dielectric layer face a same direction. The redistribution structure is disposed on the first surfaces of the conductive vias and the first surface of dielectric layer of the semiconductor die, and extends to the insulating encapsulation.

According to some alternative embodiments, a manufacturing method of a semiconductor package includes at least the following steps. A semiconductor die is covered with an insulating material. The insulating material and the semiconductor die are planarized, where during the planarizing, tops of a plurality of conductive pillars of the semiconductor die deform. The tops of the conductive pillars of the semiconductor die are removed. A redistribution structure is formed on the semiconductor die after the removing.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A semiconductor package, comprising:
 a semiconductor die comprising:
  a semiconductor substrate;
  a plurality of conductive pads distributed over the semiconductor substrate;
  a plurality of conductive vias disposed on and electrically connected to the conductive pads; and
  a dielectric layer disposed over the semiconductor substrate and spacing the conductive vias apart from one another, a sidewall of the dielectric layer extending along sidewalls of the conductive vias, the conductive vias being recessed from a top surface of the dielectric layer, and a sloped surface of the dielectric layer connected to the top surface of the dielectric layer and the sidewall of the dielectric layer; and an insulating encapsulation laterally covering the semiconductor die.

2. The semiconductor package of claim 1, wherein a top surface of one of the conductive vias of the semiconductor die is at an intersection of the sloped surface and the sidewall of the dielectric layer of the semiconductor die.

3. The semiconductor package of claim 1, wherein one of the conductive vias comprises a top surface facing away the semiconductor substrate and intersecting with the sloped surface of the dielectric layer.

4. The semiconductor package of claim 1, wherein one of the conductive vias comprises a top surface facing away the semiconductor substrate and intersecting with the sidewall of the dielectric layer.

5. The semiconductor package of claim 1, further comprising:
   a redistribution structure disposed on the insulating encapsulation and the semiconductor die, and a portion of the redistribution structure extending beyond the top surface of the dielectric layer of the semiconductor die to be in contact with the conductive vias of the semiconductor die.

6. The semiconductor package of claim 5, wherein a patterned dielectric layer of the redistribution structure covers the top surface and the sloped surface of the dielectric layer of the semiconductor die to be in contact with a first portion of the conductive vias of the semiconductor die.

7. The semiconductor package of claim 6, wherein a portion of a patterned conductive layer of the redistribution structure is laterally covered by the patterned dielectric layer of the redistribution structure and extends to be in contact with a second portion of the conductive vias of the semiconductor die that is surrounded by the first portion.

8. A semiconductor package, comprising:
   a semiconductor die comprising:
      a semiconductor substrate comprising a first surface and a second surface opposite to each other;
      a plurality of conductive vias distributed over the first surface of the semiconductor substrate; and
      a dielectric layer disposed over the first surface of the semiconductor substrate and separating the conductive vias from one another, wherein first surfaces of the conductive vias are between a first surface of the dielectric layer and the second surface of the semiconductor substrate, and the first surface of the semiconductor substrate, the first surfaces of the conductive vias, and the first surface of the dielectric layer face a same direction;
   an insulating encapsulation laterally covering the semiconductor die; and
   a redistribution structure disposed on the first surfaces of the conductive vias and the first surface of the dielectric layer of the semiconductor die, and extending to the insulating encapsulation.

9. The semiconductor package of claim 8, wherein a second surface of the dielectric layer of the semiconductor die connected to the first surface of the dielectric layer is inclined toward the first surfaces of the conductive vias of the semiconductor die.

10. The semiconductor package of claim 9, wherein an angle between the second surface of the dielectric layer of the semiconductor die and the first surfaces of the conductive vias is an obtuse angle.

11. The semiconductor package of claim 9, wherein the second surface of the dielectric layer of the semiconductor die intersects with at least one of the first surfaces of the conductive vias of the semiconductor die.

12. The semiconductor package of claim 9, wherein the second surface of the dielectric layer of the semiconductor die connects the first surface of the dielectric layer to a third surface of the dielectric layer, and the third surface of the dielectric layer intersects with at least one of the first surfaces of the conductive vias of the semiconductor die.

13. The semiconductor package of claim 8, wherein a width of the first surface of the dielectric layer between adjacent ones of the conductive vias is less than a shortest lateral distance between the adjacent ones of the conductive vias.

14. The semiconductor package of claim 1, wherein an angle between a top surface of one of the conductive vias of the semiconductor die and the sloped surface of the dielectric layer of the semiconductor die is an obtuse angle.

15. The semiconductor package of claim 1, wherein a width of the top surface of the dielectric layer between adjacent ones of the conductive vias is less than a shortest lateral distance between the adjacent ones of the conductive vias.

16. The semiconductor package of claim 5, further comprising:
   a plurality of conductive terminals disposed on the redistribution structure and electrically coupled to the semiconductor die through the redistribution structure.

17. The semiconductor package of claim 8, wherein a portion of the redistribution structure extending beyond the first surface of the dielectric layer of the semiconductor die to be in contact with the conductive vias of the semiconductor die.

18. The semiconductor package of claim 8, wherein the redistribution structure comprises a patterned dielectric layer, the dielectric layer of the semiconductor die comprises a sloped surface connected to the first surface of the dielectric layer, and the patterned dielectric layer covers the first surface of the dielectric layer and the sloped surface of the dielectric layer.

19. The semiconductor package of claim 18, wherein the redistribution structure further comprises a patterned conductive layer, and the patterned conductive layer is laterally covered by the patterned dielectric layer and is in direct contact with the conductive vias of the semiconductor die.

20. The semiconductor package of claim 8, further comprising:
   a plurality of conductive terminals disposed on the redistribution structure and electrically coupled to the semiconductor die through the redistribution structure.

* * * * *